(12) United States Patent
Kanatzidis et al.

(10) Patent No.: US 11,249,203 B2
(45) Date of Patent: Feb. 15, 2022

(54) THICK ALKALI METAL HALIDE PEROVSKITE FILMS FOR LOW DOSE FLAT PANEL X-RAY IMAGERS

(71) Applicant: Northwestern University, Evanston, IL (US)

(72) Inventors: Mercouri G. Kanatzidis, Wilmette, IL (US); Yadong Xu, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 16/649,862

(22) PCT Filed: Sep. 27, 2018

(86) PCT No.: PCT/US2018/053131
§ 371 (c)(1),
(2) Date: Mar. 23, 2020

(87) PCT Pub. No.: WO2019/067724
PCT Pub. Date: Apr. 4, 2019

(65) Prior Publication Data
US 2020/0225367 A1     Jul. 16, 2020

Related U.S. Application Data

(60) Provisional application No. 62/565,358, filed on Sep. 29, 2017.

(51) Int. Cl.
*G01T 1/24*     (2006.01)
*C01B 19/00*    (2006.01)
(Continued)

(52) U.S. Cl.
CPC ............. *G01T 1/24* (2013.01); *C01B 19/002* (2013.01); *G01T 1/17* (2013.01); *H01L 27/308* (2013.01);
(Continued)

(58) Field of Classification Search
CPC ............. H01L 31/0236; H01L 31/0272; H01L 31/022466; G01T 1/17
See application file for complete search history.

(56) References Cited

U.S. PATENT DOCUMENTS 3,043,955 A    1/1960  Friedland et al.
8,519,347 B2 * 8/2013  Kanatzidis ............ H01L 31/085
                                                 250/370.09
(Continued)

OTHER PUBLICATIONS

The International Search Report & Written Opinion issued in International patent application No. PCT/US18/53131 dated Dec. 11, 2018, pp. 1-9.
(Continued)

*Primary Examiner* — David P Porta
*Assistant Examiner* — Shun Lee
(74) *Attorney, Agent, or Firm* — Bell & Manning, LLC

(57) ABSTRACT

Methods and devices that use alkali metal chalcohalides having the chemical formula $A_2TeX_6$, wherein A is Cs or Rb and X is I or Br, to convert hard radiation, such as X-rays, gamma-rays, and/or alpha-particles, into an electric signal are provided. The devices include optoelectronic and photonic devices, such as photodetectors and photodiodes. The method includes exposing the alkali metal chalcohalide material to incident radiation, wherein the material absorbs the incident radiation and electron-hole pairs are generated in the material. A detector is configured to measure a signal generated by the electron-hole pairs that are formed when the material is exposed to incident radiation.

11 Claims, 25 Drawing Sheets

(51) Int. Cl.
| | |
|---|---|
| *H01L 27/30* | (2006.01) |
| *H01L 31/0236* | (2006.01) |
| *H01L 31/0272* | (2006.01) |
| *H01L 31/0224* | (2006.01) |
| *G01T 1/17* | (2006.01) |

(52) U.S. Cl.
CPC ...... *H01L 31/0236* (2013.01); *H01L 31/0272* (2013.01); *H01L 31/022466* (2013.01)

(56) References Cited

U.S. PATENT DOCUMENTS

| | | | |
|---|---|---|---|
| 9,181,475 B2 | 11/2015 | Kanatzidis et al. | |
| 9,803,136 B2 | 10/2017 | Kanatzidis et al. | |
| 9,966,198 B2 | 5/2018 | Kanatzidis et al. | |
| 2012/0153178 A1* | 6/2012 | Kanatzidis | H01L 31/085 250/370.12 |
| 2013/0221241 A1* | 8/2013 | Rowlands | H04N 5/32 250/473.1 |
| 2015/0249170 A1 | 9/2015 | Snaith et al. | |
| 2016/0121138 A1 | 5/2016 | Carpenter et al. | |

OTHER PUBLICATIONS

Dance, N. et al., "1291 Mossbauer spectra of tellurium Iodides," Part II. Canadian Journal of Chemistry, 1981 [retrieved on Nov. 1, 2018]. Retrieved from the Internet: <URL: http://www.nrcresearchpress.com/doi/pdf/10.1139/V81-132>; p. 918, first column, first paragraph.

Chandrasekhar, P. S., et al. "Fabrication of perovskite films using an electrostatic assisted spray technique: the effect of the electric field on morphology, crystallinity and solar cell performance." *Nanoscale* 8.12 (2016): 6792-6800.

Ju, Jungmyoung, Yutaka Yamagata, and Toshiro Higuchi. "Thin-film fabrication method for organic light-emitting diodes using electrospray deposition." *Advanced Materials* 21.43 (2009): 4343-4347.

Lee et al., "Air-Stable Molecular Semiconducting Iodosalts for Solar Cell Applications: CS2Snl6 as a Hole Conductor," *J. Am. Chem. Soc.* 2014, vol. 136, pp. 15379-15385. dx.doi.org/10.1021/ja508464w.

Mercouri Kanatziais, Technical Report—"Novel Chalcogenide Materials tor x-ray ana γ-ray Detection," Defense Threat Reduction Agency, DTRA-TR-16-53, May 2016, pp. 1-63.

Yao Cai, et al., "Computational Study of Halide Perovskite-Derived A2BX6 Inorganic Compounds: Chemical Trends in Electronic Structure and Structural Stability," institute of Materials Research and Engineering (IMRE), Agency for Science, Technology and Research (A*STAR), Singapore, pp. 1-29. arXiv:1706.08674v1 [cond-mat.mtrl-sci] Jun. 27, 2017.

Hong, Seung Chan, et al. "Precise morphology control and continuous fabrication of perovskite solar cells using droplet-controllable electrospray coating system." *ACS applied materials & interfaces*, vol. 9, No. 9, Feb. 20, 2017; pp. 7879-7884.

Bi, Zhuoneng, et al. "Fast preparation of uniform large grain size perovskite thin film in air condition via spray deposition method for high efficient planar solar cells." *Solar energy materials and solar cells*, vol. 162, Apr. 2017; pp. 13-20.

Kavadiya, Shalinee, et al. "Electrospray-Assisted Fabrication of Moisture-Resistant and Highly Stable Perovskite Solar Cells at Ambient Conditions." *Advanced Energy Materials*, vol. 7, Issue18, May 12, 2017; p. 1700210.

Han, Sunghoon, et al. "Efficient Planar-Heterojunction Perovskite Solar Cells Fabricated by High-Throughput Sheath-Gas-Assisted Electrospray." *ACS applied materials & interfaces*, vol. 10, Issue 8, Feb. 6, 2018; pp. 7281-7288.

Indika U. Arachchige, et al., "Mercouri G. Kanatzidis: Excellence and Innovations in Inorganic and Solid-State Chemistry," *Inorg. Chem.*, Jun. 27, 2017, vol. 56, No. 14; pp. 7582-7597.

* cited by examiner

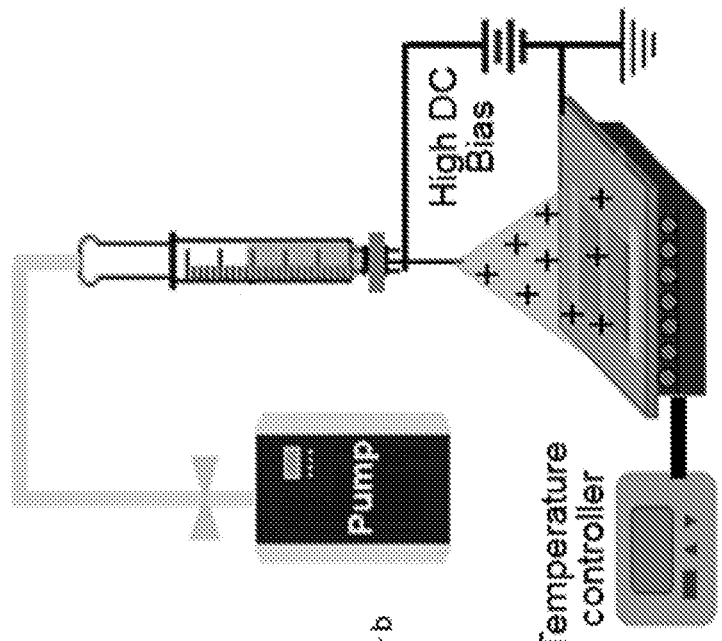
FIG. 1A
FIG. 1C
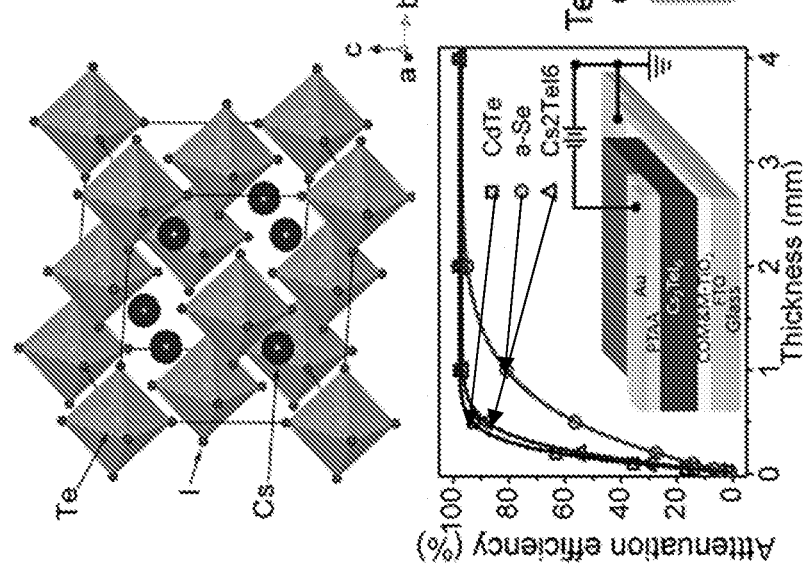
FIG. 1B

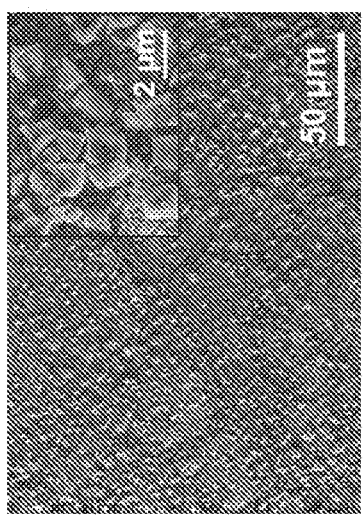
FIG. 2B
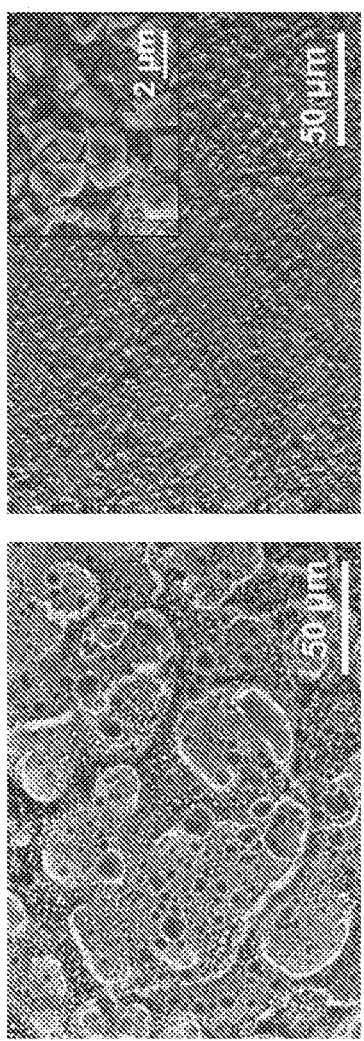
FIG. 2A
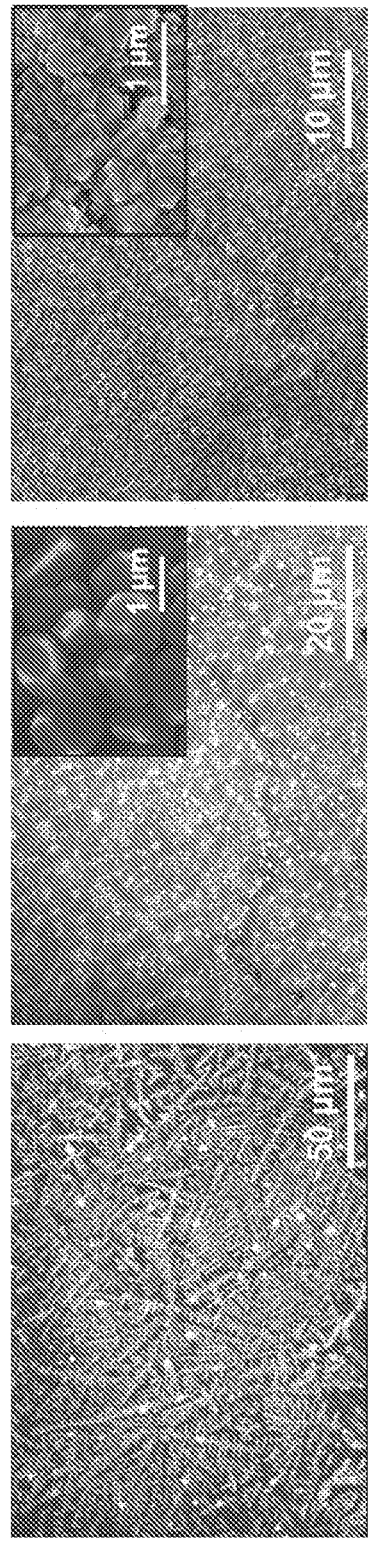
FIG. 2E
FIG. 2D
FIG. 2C

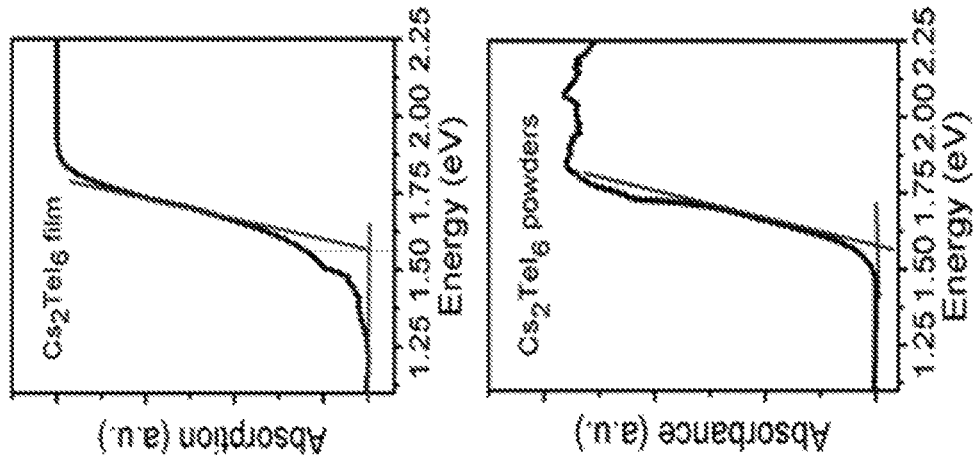
FIG. 3A
FIG. 3B
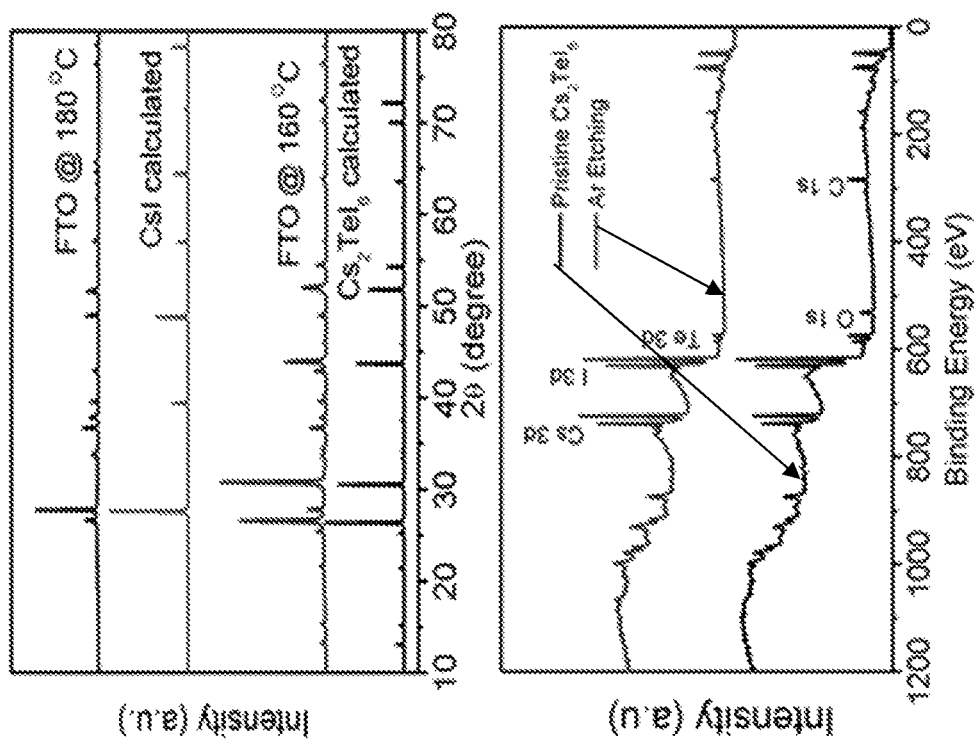
FIG. 3C
FIG. 3D

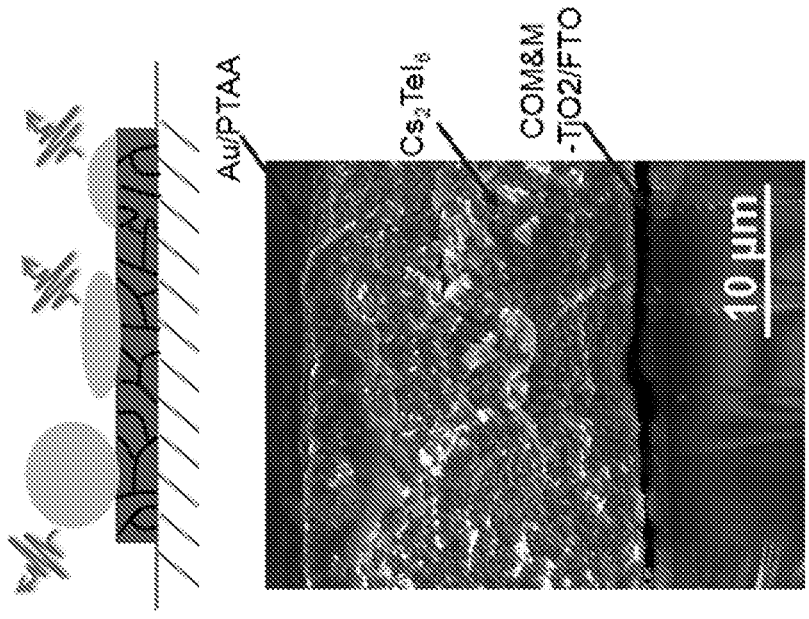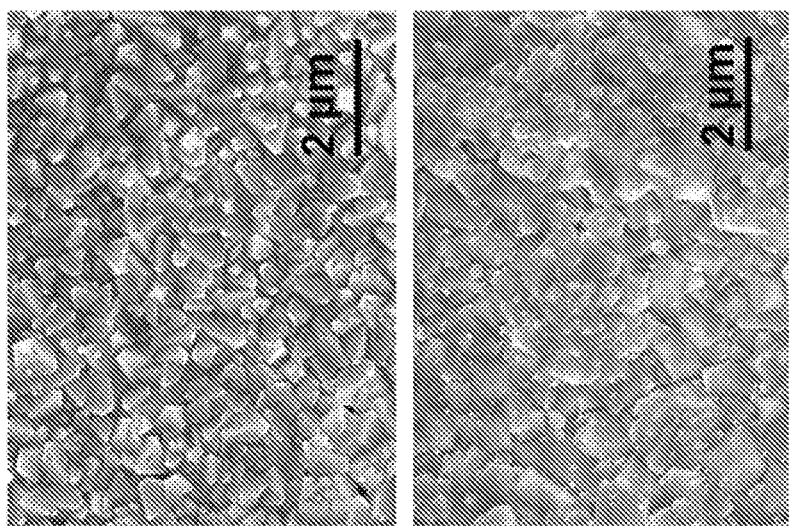
FIG. 4A  FIG. 4B  FIG. 4C  FIG. 4D

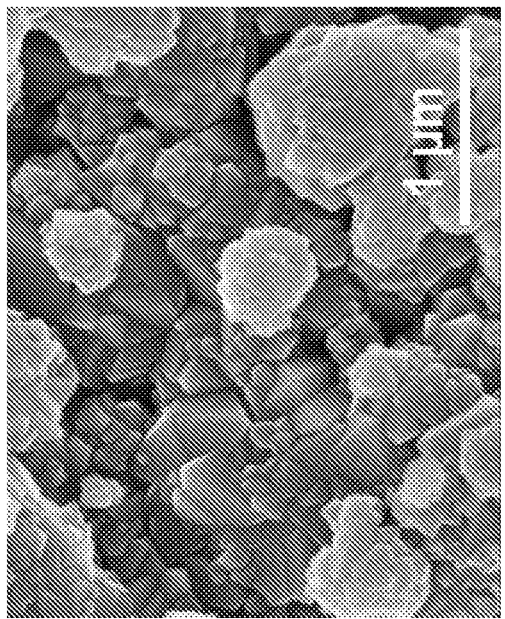
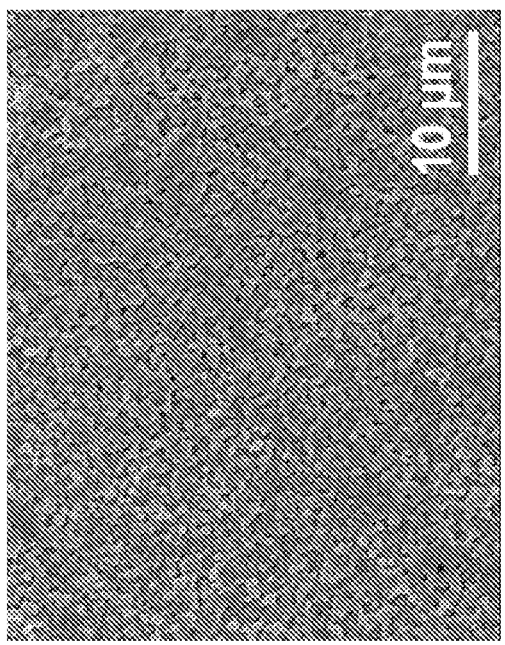
FIG. 7

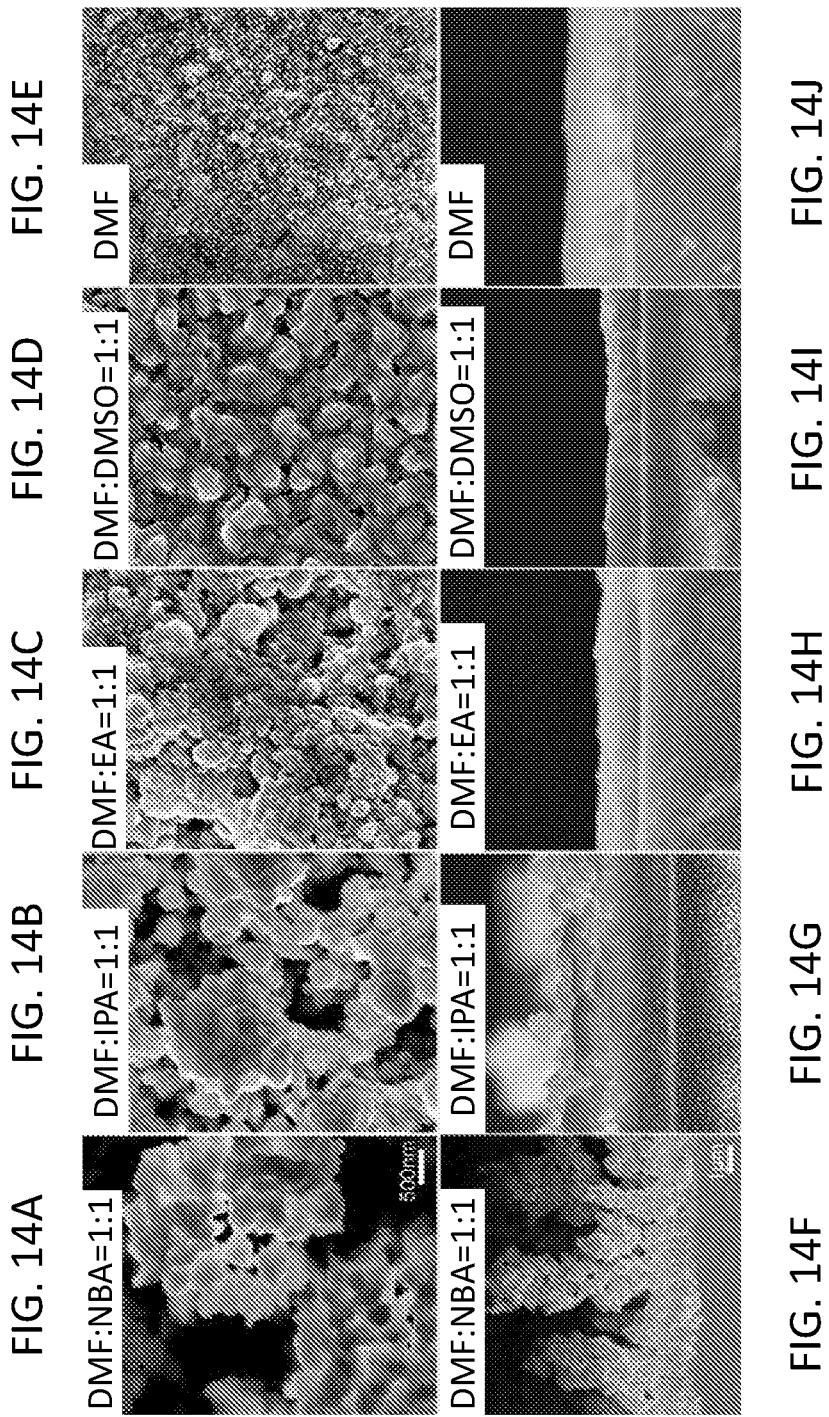

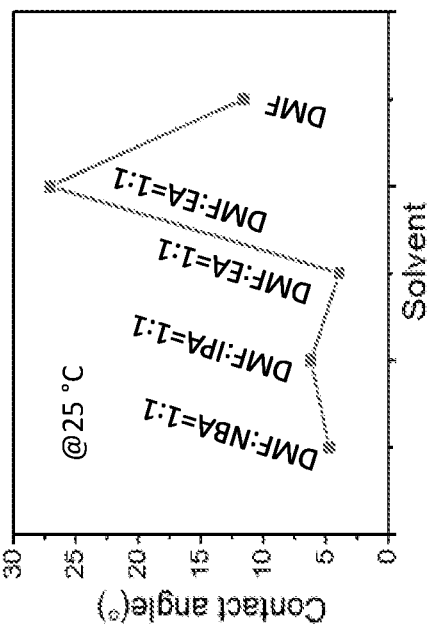
FIG. 15A DMF:NBA=1:1 4.7°
FIG. 15B DMF:IPA=1:1 6.2°
FIG. 15C DMF:EA=1:1 3.9°
FIG. 15D DMF:DMSO=1:1 27.1°
FIG. 15E DMF 11.6°
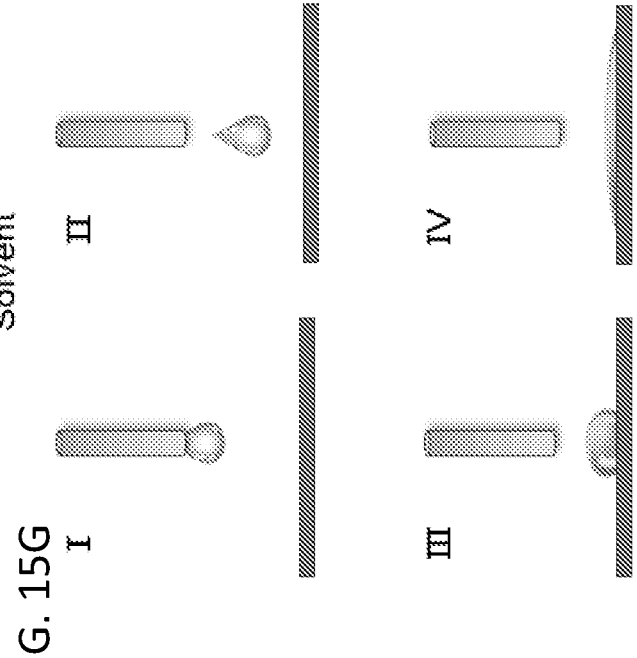
FIG. 15F
FIG. 15G

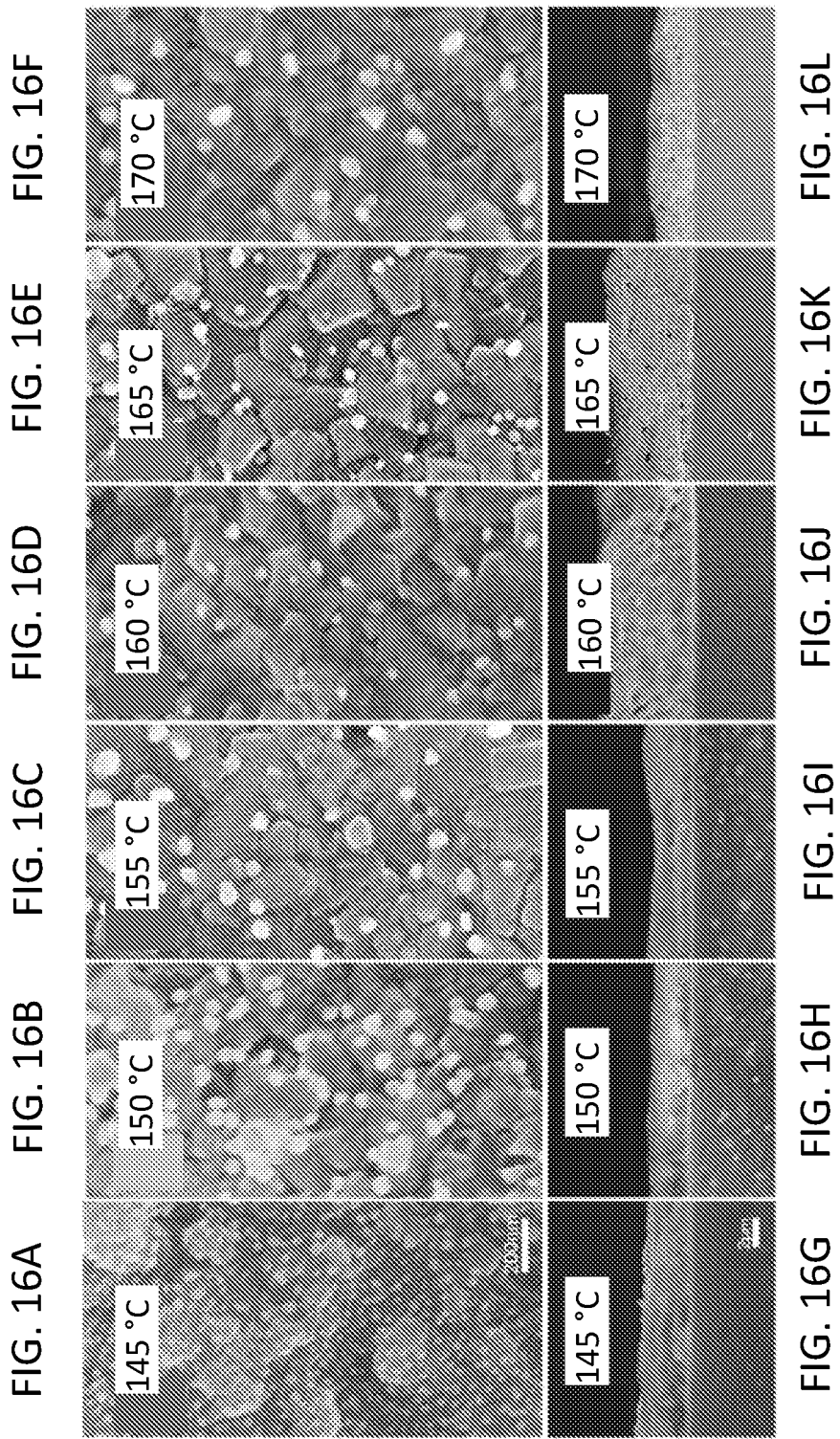

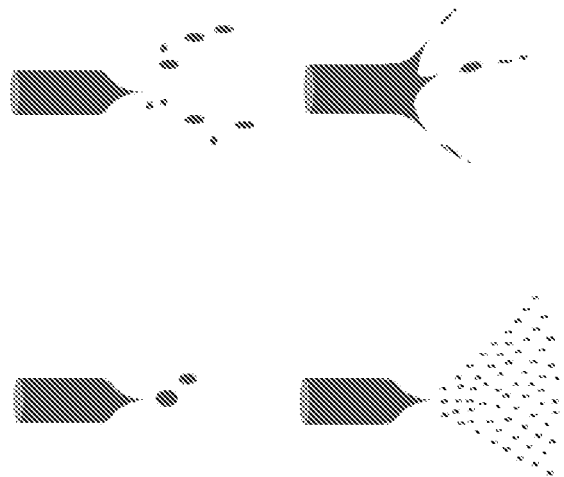
FIG. 17E
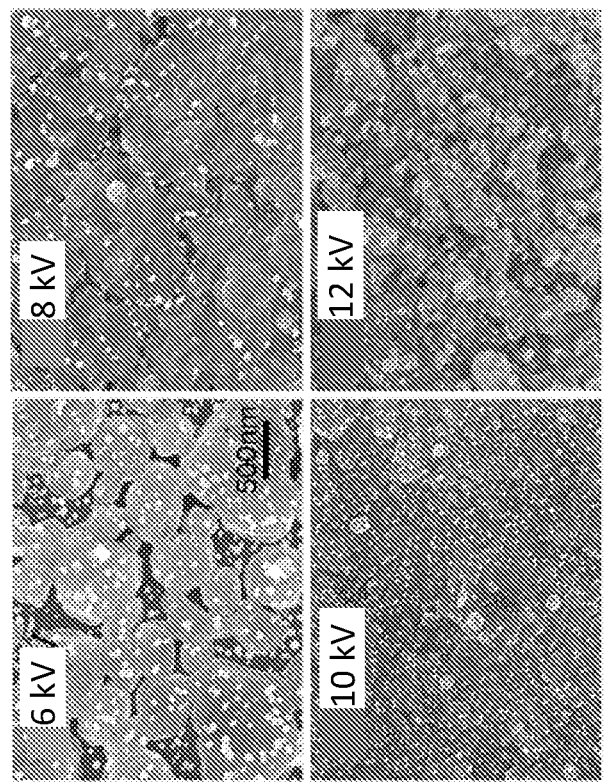
FIG. 17A  FIG. 17B
FIG. 17C  FIG. 17D

THICK ALKALI METAL HALIDE PEROVSKITE FILMS FOR LOW DOSE FLAT PANEL X-RAY IMAGERS

CROSS-REFERENCE TO RELATED APPLICATIONS

This application is a National Stage of International Application No. PCT/US2018/053131, filed Sep. 27, 2018, which claims the benefit of U.S. Patent Application No. 62/565,358, filed Sep. 29, 2017, the contents of which are herein incorporated by reference.

REFERENCE TO GOVERNMENT RIGHTS

This invention was made with government support under 2014-DN-077-ARI086-01 awarded by the Department of Homeland Security. The government has certain rights in the invention.

BACKGROUND

Flat panel X-ray imagers (FPXIs) are widely used for reliable and affordable digital X-ray imaging in medical, security, and industrial settings. This has brought about the introduction of a new generation of digital ionizing radiation imaging devices that are based on the growth of layers of materials appropriate for radiation detection. Currently, there are two categories of FPXIs: those based on thin-film transistors (TFT), and those based on complementary metal-oxide semiconductors (CMOS). In indirect imaging devices, a scintillator is deposited onto TFT/CMOS, which collects the optical light produced by the X-ray irradiation. In the direct conversion model, a semiconductor layer is grown on the TFT/CMOS array, which converts X-ray photons directly to electrical signals. High sensitivity is paramount to allow detection of weak X-ray dose rates under shorter exposure times, which is especially important in reducing health risks by further minimizing X-ray exposure during routine medical inspections.

Generally, direct conversion is a superior method because it has better modulation transfer function and higher detective quantum efficiency. For direct and digital imaging, the active material should be a semiconductor with suitable photonic properties, such as a high atomic absorption coefficient, wide energy band gap ($E_g$) but low formation energy for an electron-hole pair by the incident radiation, high resistivity, and large charge carrier mobility-life-time product ($\mu\tau$). Potential materials such as amorphous selenium ($\alpha$-Se), CdTe, CZT, and PbO, have been studied as photoconductors for digital radiation imaging. (See, Kasap, S. O. X-ray sensitivity of photoconductors: application to stabilized a-Se. *J. Phys. D: Appl. Phys.* 2000, 33, 2853-2865; Chen, F., et al. Direct-conversion X-ray detector using lateral amorphous selenium structure. *IEEE Sensors J.* 2011, 11, 505-509; Kasap, S., et al. Amorphous selenium and its alloys from early xeroradiography to high resolution X-ray image detectors and ultrasensitive imaging tubes. *Phys. Status Solidi B.* 2009, 246, 1794-1805; Abbene, L., et al. Direct measurement of mammographic X-Ray spectra with a digital CdTe detection system. *Sensors.* 2012, 12, 8390-8404; Niraula, M., et al. Vapor-phase epitaxial growth of thick single crystal CdTe on Si substrate for X-ray, gamma ray spectroscopic detector development. *Phys. Status Solidi c.* 2014, 11, 1333-1336; Tokuda, S., et al. Preparation and characterization of polycrystalline CdZnTe films for large-area, high-sensitivity X-ray detectors. *J. Mate. Sci.* 2004, 15, 1-8; Dvoryankina, V. F., et al. V. X-Ray Sensitivity of $Cd_{0.9}Zn_{0.1}Te$ Detectors. *Technical Physics,* 2010, 55, 306-308; Simon, M., et al. Overdick, M.; Powell, M. J.; Wiechert, D. U. Analysis of lead oxide (PbO) layers for direct conversion X-ray detection, *IEEE Trans. Nucl. Sci.* 2005, 52, 2035-2040; and Kabir, M. Z. Effects of charge carrier trapping on polycrystalline PbO X-ray imaging detectors, *J. Appl. Phys.* 2008, 104, 074507-074516.) However, to preserve the stability of TFT or CMOS devices, the film growth should be restricted to temperatures up to 200° C. (See, Fornaro, L. State of the art of the heavy metal iodides as photoconductors for digital imaging. *J. Crys. Grow.* 2013, 371, 155-162.) $\alpha$-Se can be easily evaporated onto a large area, making it a dominant active matrix for X-ray imaging because of its low boiling point. However, its detection efficiency is limited due to its the lower atomic number (Z=34), poor mobility-lifetime product ($\mu\tau$), and relatively higher creation energy of the electron-hole pair ($E_{pair}$=50 eV). In addition, long-term instability is a bottle neck for $\alpha$-Se as crystallization starts when the temperature is over 70° C. (See, Chizhikov, D. M., et al., Selenium and Selenides. Collet's, London 1968.) Heavy metal iodide binaries ($HgI_2$, $PbI_2$, and $BiI_3$) have also been adopted as the alternative photoconductor materials. (See, Kang, Y., et al., Examination of and photoconductive materials for direct detection, active matrix, flat-panel imagers for diagnostic X-ray imaging. *IEEE Trans. Nucl. Sci.* 2005, 52, 38-45; Shah, K. S., et al., X-ray imaging with PbI2-based a-Si:H flat panel detectors. *Nucl. Instrum. Meth. Phys. Res. A.* 2001, 458, 140-147; and Gokhale, S. S., et al., Growth, fabrication, and testing of bismuth tri-iodide semiconductor radiation detectors. *Radiation Measurements.* 2015, 74, 47-52.) $HgI_2$ suffers from severe phase transformation during layer growth, whereas $PbI_2$ and $BiI_3$ have the tendency to dissociate in the vapor phase. (See, Piechotka, M., Mercuric iodide for room temperature radiation detectors, Synthesis, purification, crystal growth and defect formation, *Mate. Sci. Eng. R.* 1997, 18, 1-98; Saucedo, E., et al., New ways for purifying lead Iodide appropriate as spectrometric grade material. *IEEE Trans. Nucl. Sci.* 2002, 49, 1974-1977; Cubicciotti, D., et al., The Vapor Pressure of $BiI_3$ over Liquid Bi—$BiI_3$ Solutions. *J. Phys. Chem.* 1959, 63, 295-297.) In addition, these 2D materials have poor crystalline orientation, which results in significant anisotropy in their charge transport behavior.

Recently, organic-inorganic hybrid ($MAPbX_3$, where X is Cl, Br or I) perovskite crystals have been studied in nuclear radiation detection because of their favorable transport behaviors, which are also attractive for photoconductive layers. (See, Yakunin, S., et al., Detection of X-ray photons by solution-processed lead halide perovskites. *Nature Photonics.* 2015, 9, 444-450; Wei, H., et al., Sensitive X-ray detectors made of methylammonium lead tribromide perovskite single crystals. *Nature Photonics.* 2016, 10, 333-339; Yakunin, S., et al., Detection of gamma photons using solution-grown single crystals of hybrid lead halide perovskites. *Nature Photonics.* 2016, 10, 585-589; and Wei, W., et al., Monolithic integration of hybrid perovskite single crystals with heterogeneous substrate for highly sensitive X-ray imaging. *Nature Photonics.* 2017, 11, 315-321.) However, the $MAPbX_3$ is temporally unstable to moisture and polarizes electrically in high applied electric fields. It is also a challenge to grow the $MAPbX_3$ films to the desired thickness of over one hundred micrometers using solution processing methods for high X-ray absorption efficiency.

SUMMARY

Methods and radiation detectors that use alkali metal chalcohalides having the chemical formula $A_2TeX_6$, wherein A is Cs or Rb and X is I or Br, to convert incident radiation, such as incident X-rays, into an electric signal are provided.

One embodiment of a method for detecting incident radiation includes exposing a material comprising alkali metal chalcohalides having the chemical formula $A_2TeX_6$, wherein A is Cs or Rb and X is I or Br, to incident X-ray, gamma-ray, and/or alpha particle radiation, wherein the material absorbs the incident radiation and electron-hole pairs are generated in the material; and measuring at least one of the energy and intensity of the absorbed incident radiation by detecting the generated electrons, holes, or both.

One embodiment of a device for the detection of incident radiation includes: a material comprising alkali metal chalcohalides having the chemical formula $A_2TeX_6$, wherein A is Cs or Rb and X is I or Br; a first electrode in electrical communication with the material; a second electrode in electrical communication with the material, wherein the first and second electrodes are configured to apply an electric field across the material; and a detector configured to measure a signal generated by electron-hole pairs that are formed when the material is exposed to incident radiation.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1A depicts the cubic crystal structure of $Cs_2TeI_6$. FIG. 1B shows the attenuation efficiency of $Cs_2TeI_6$, CdTe and α-Se to 50 keV X-ray photons vs thickness according to the photoelectric effect; inset is the diagram of the multilayer device. FIG. 1C shows a schematic of the E-spray deposition process and the corresponding $Cs_2TeI_6$ solutions and films.

FIGS. 2A-2E depict SEM images and surface morphology of E-sprayed $Cs_2TeI_6$ thick films using DMF/ethanol solution and FTO substrate. FIG. 2A shows a solvent ratio and temperature of 7:3 at 160° C. FIG. 2B shows a solvent ratio and temperature of 3:7 at 160° C. FIG. 2C shows a solvent ratio and temperature of 5:5 at 110° C. FIG. 2D shows a solvent ratio and temperature of 5:5 at 175° C. FIG. 2E shows a solvent ratio and temperature of 5:5 at 160° C.

FIG. 3A depicts an experimental powder X-ray diffraction pattern of E-spray films compared to the simulated pattern. FIG. 3B shows optical absorbance spectra of the $Cs_2TeI_6$ film. FIG. 3C shows an XPS survey of the $Cs_2TeI_6$ film before and after sputtering. FIG. 3D depicts optical absorbance spectra of bulk polycrystalline sample of $Cs_2TeI_6$.

FIG. 4A depicts the morphology of $Cs_2TeI_6$ films after spraying for 5 min. FIG. 4B shows a diagram of evaporation and nucleation during E-spray. FIG. 4C depicts the morphology of $Cs_2TeI_6$ films after spraying for 120 min. FIG. 4D shows a cross-sectional SEM image of glass/FTO/c-&m-$TiO_2$+$Cs_2TeI_6$/PTAA/Au film prepared under a DMF/Ethanol ratio of 5:5 at 160° C.

FIG. 5A depicts the corresponding I-V curves; inset is under electrical field strength of 4000 V·cm$^{-1}$. FIG. 5B shows current density with and without illumination. FIG. 5C shows steady-state I-V measurements under an applied electric field of 400 V·cm$^{-1}$, illuminated by ambient light, with bias applied to the FTO contact. FIG. 5D shows I-V characteristics of a 25-μm-thick $Cs_2TeI_6$ film in darkness and under X-ray illumination. FIG. 5E depicts the time response for an on/off switched X-ray beam. FIG. 5F plots X-ray photocurrent as a function of X-ray generator bias and X-ray photocurrent as a function of exposure dose rate.

FIG. 7 shows SEM images of $Cs_2TeI_6$ films. When the solvent evaporates rapidly, nano-size clusters are formed.

FIG. 9A shows the absorption spectra of $Cs_2TeI_6$ precursor solution at different concentrations, showing a significant blue shift of the absorption with respect to $Cs_2TeI_6$ absorption. FIG. 9B shows the absorption spectra of $Cs_2TeI_6$ precursor solution, and each precursor absorption. The $Cs_2TeI_6$ precursor absorption is comparable with the $TeI_4$ absorption, indicating nano-size $Cs_2TeI_6$ precipitates were not formed in the solution. The CsI solution shows no absorption at the visible range and is also transparent to the eye (also at high concentrations).

FIG. 11A shows that, after wafer processing and device fabrication, α particle induced pulse height spectra was measured using an un-collimated $^{241}$Am (5.48 MeV) radioactive source at room temperature. The electron mobility lifetime products $(\mu\tau)_e$ of the $Cs_2TeI_6$ crystals were predicted by fitting the plots of photo-peak position vs electrical field strength using the single carrier Hecht equation:

Figures 11A, 11B:
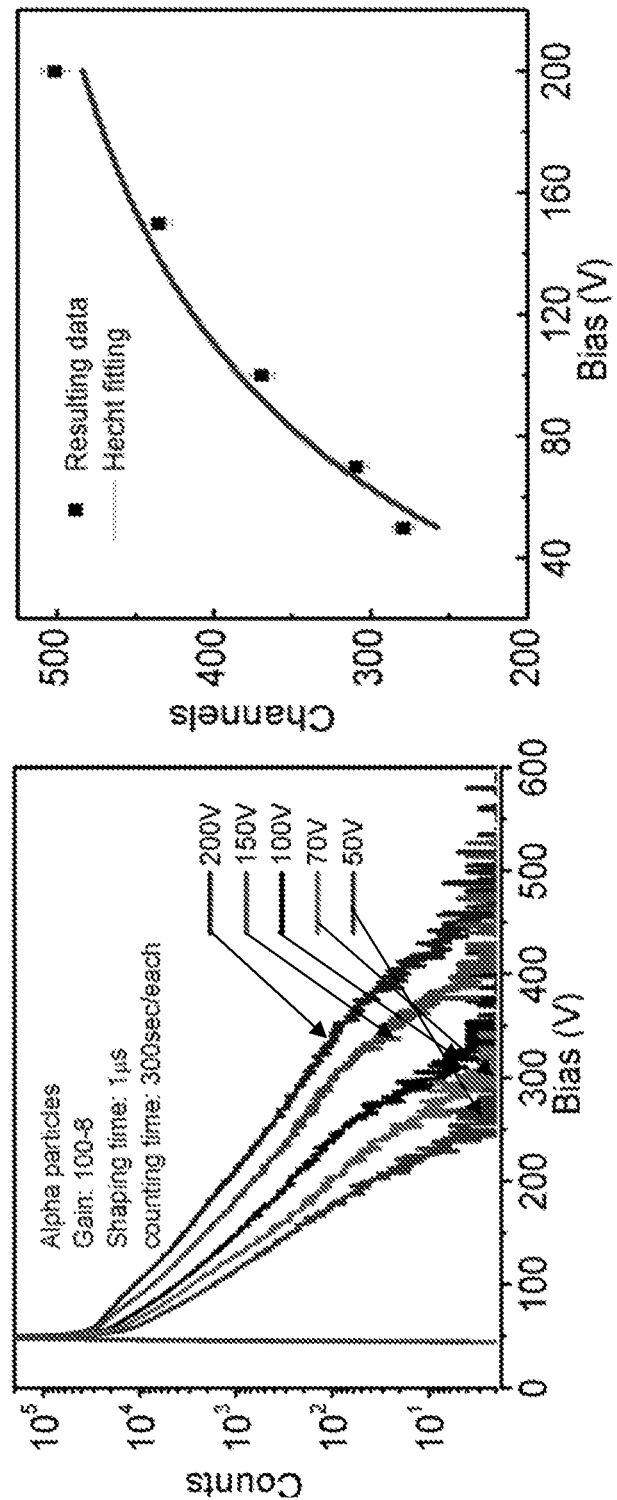
FIGS. 11A and 11B depict the alpha response of $Cs_2TeI_6$ bulk crystals obtained by the vertical Bridgman method.

$$CCE \approx \frac{\mu\tau V}{d^2}\left[1 - \exp\left(\frac{d^2}{\mu\tau V}\right)\right] \quad (1)$$

where CCE is the charge collection efficiency, and μ and τ are the carrier mobility and lifetime, respectively. D is the sample thickness. V is the applied electrical bias. FIG. 11B shows a $(\mu\tau)_e$ value of $5.2\times10^{-5}$ cm$^2$V$^{-1}$ was obtained for the as-grown $Cs_2TeI_6$ crystals.

Figure 12:
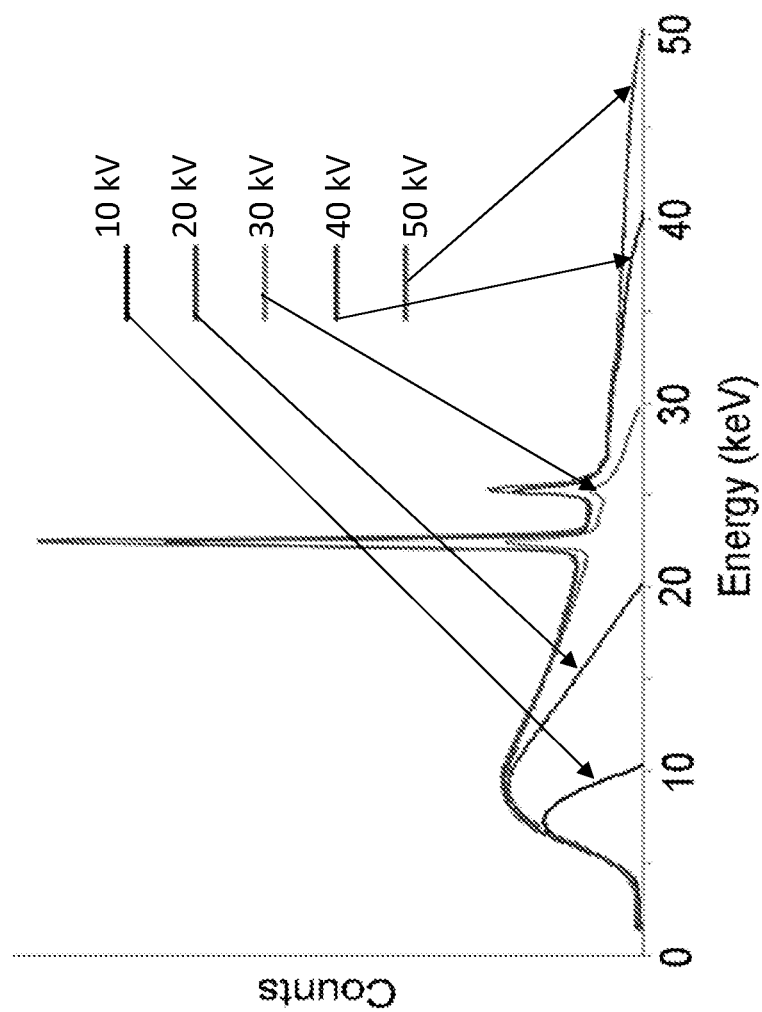

FIG. 12 depicts the mini-X silver (Ag) output spectra at 10, 20, 30, 40 and 50 kVp.

Figure 13:
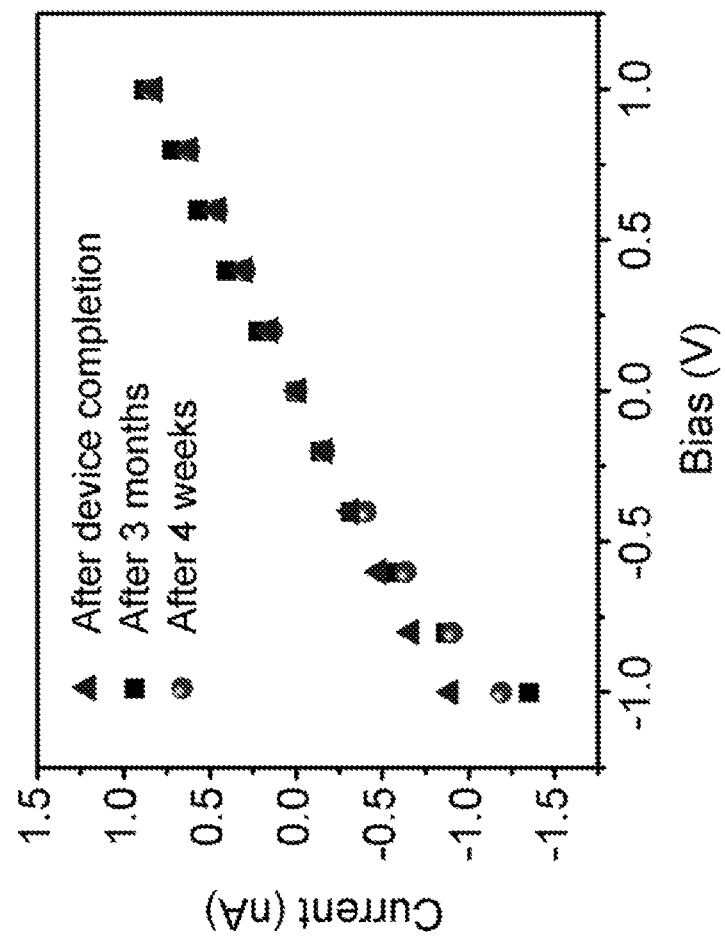

FIG. 13 depicts room-temperature I-V characteristics over a period of 3 months for a 25-μm-thick planar $Cs_2TeI_6$ device under applied electric field of 400 V·cm$^{-1}$.

FIGS. 14A-14E show top-view SEM images of $Cs_2TeI_6$ films deposited by electrospray performed at T=150° C., V=10 kV and Q=1 mL/h with different solvents. Here, T is substrate temperature, V is electrical bias, Q is quantity of flow. The film coverage ratio goes up rapidly. As shown in FIGS. 14A-14C, there are many clusters on the surface, and the films are rough and uneven. The clusters from left to right become smaller and smaller. As shown in FIGS. 14D-14E, the films become smooth with no obvious clusters, but there are still some pinholes. FIGS. 14F-14J show cross-sectional SEM images corresponding to FIGS. 14A-14E. The scale bars for the top row are 500 nm, and for the row below are 1 μm.

FIGS. 15A-15E show contact angles of different solvents on glass/FTO/c-$TiO_2$/m-$TiO_2$ substrates that are the same as the substrates used in electrospray. FIG. 15F is a broken line graph of the results from FIGS. 15A-15E. FIG. 15G shows the falling process of the droplet.

FIGS. 16A-16F show top-view SEM images of $Cs_2TeI_6$ films deposited by electrospray performed at V=10 kV, Q=1 mL/h with DMF solvent, under different temperatures, from 145° C. to 170° C. FIGS. 16G-16L show cross-sectional SEM images corresponding to FIGS. 16A-16F. The scale bars for the top row are 200 nm, and for the row below are 2 μm.

FIGS. 17A-17D show top-view SEM images of $Cs_2TeI_6$ films deposited by electrospray performed at T=160° C., Q=1 mL/h with DMF solvent, under 6 kV, 8 kV, 10 kV, 12 kV respectively. FIG. 17E is a sketch map of droplets dispersion. The scale bars in the SEM images are 500 nm.

Figure 18A:
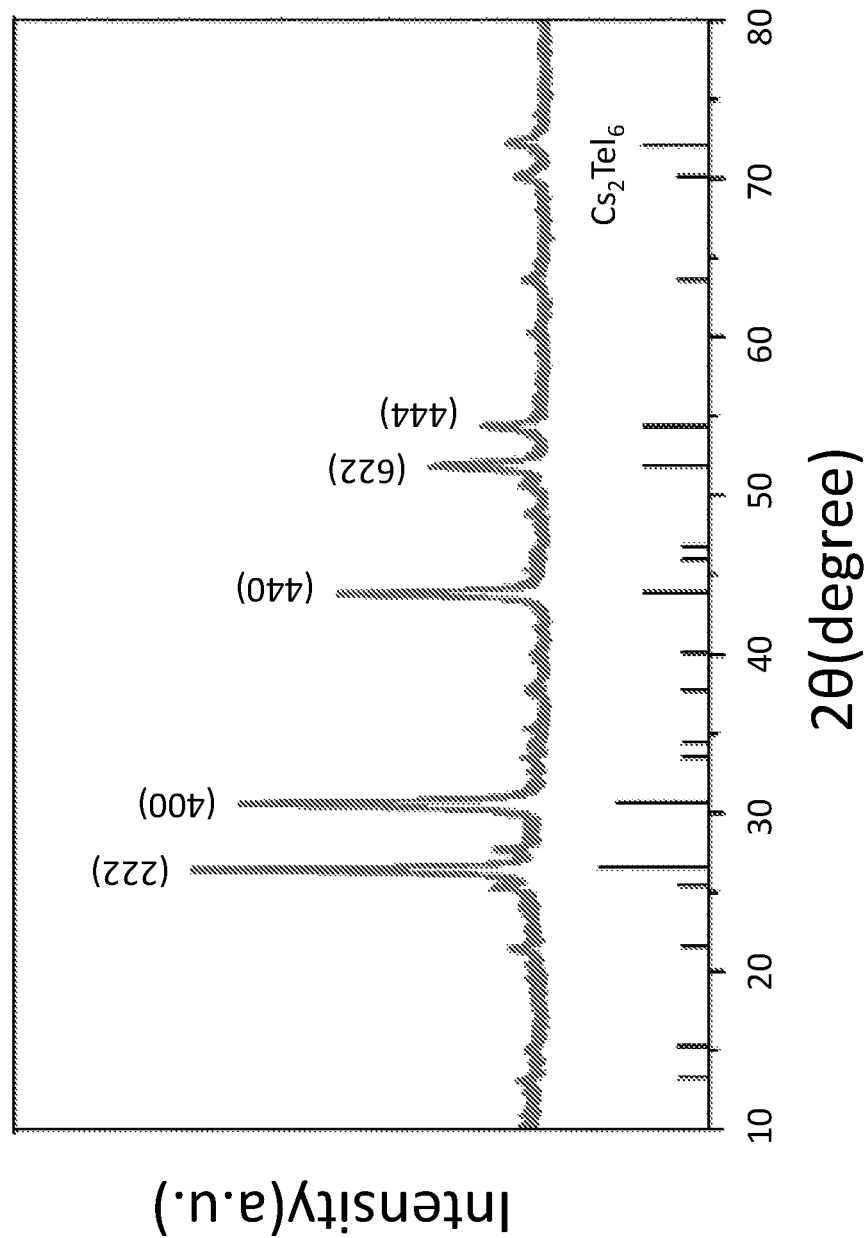
Figure 18B:
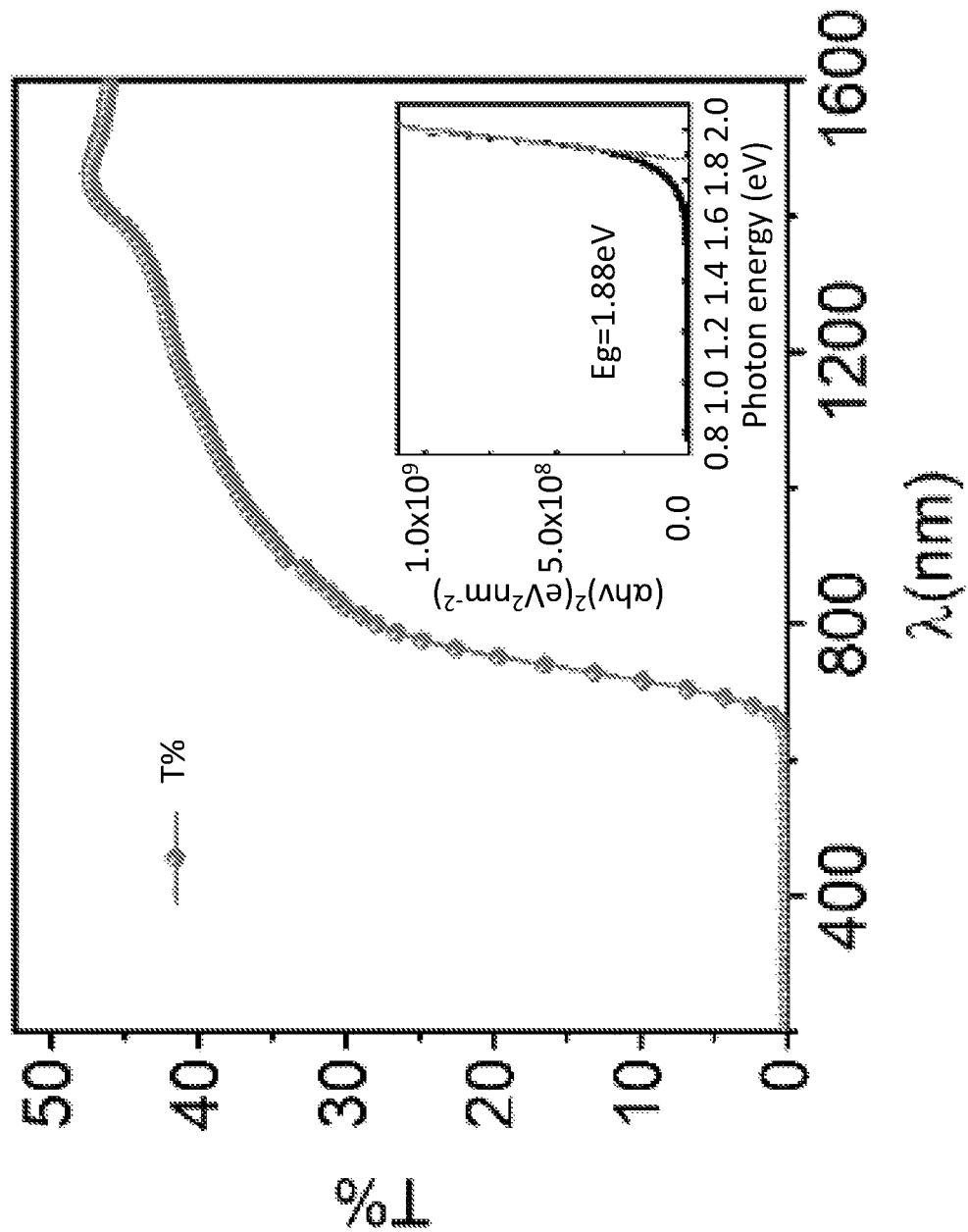
Figure 18C:
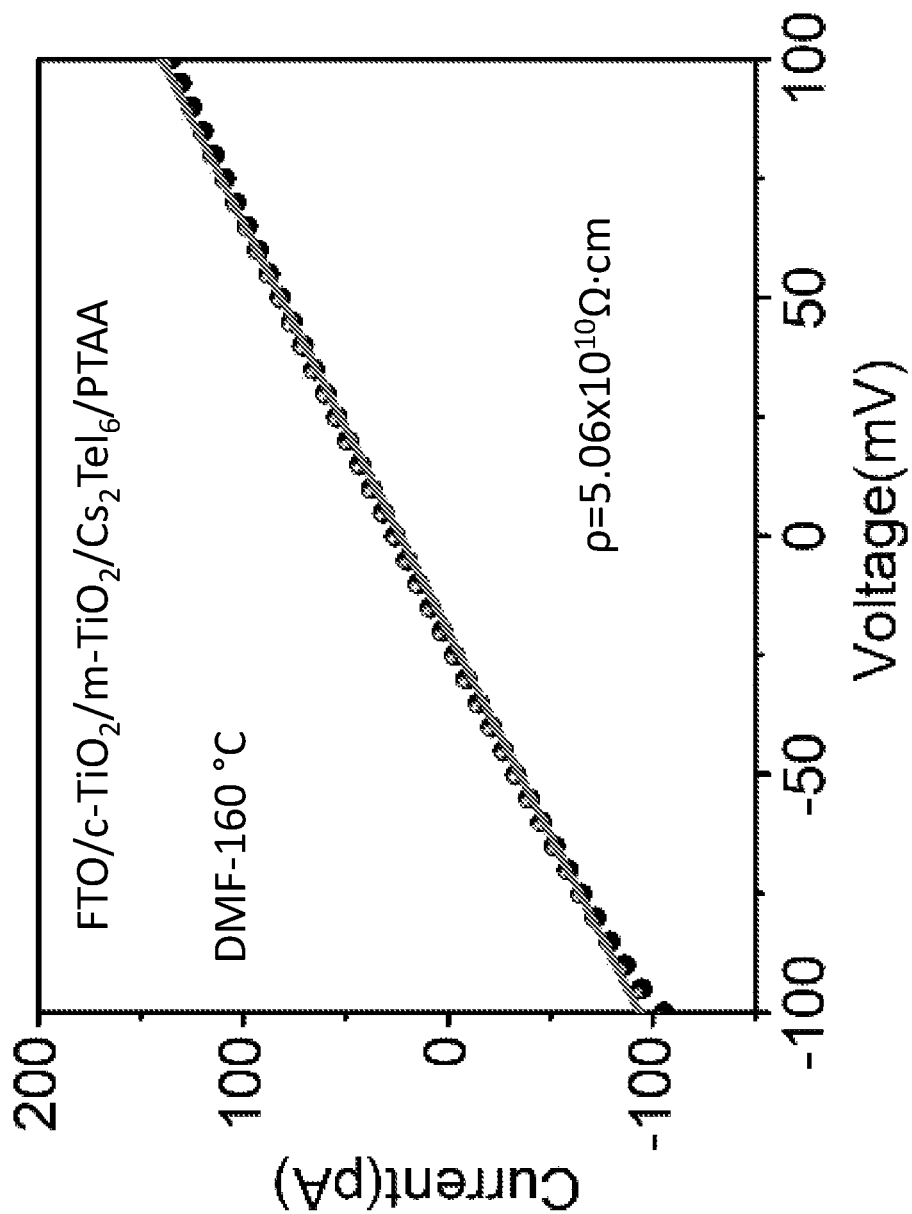
Figure 18D:
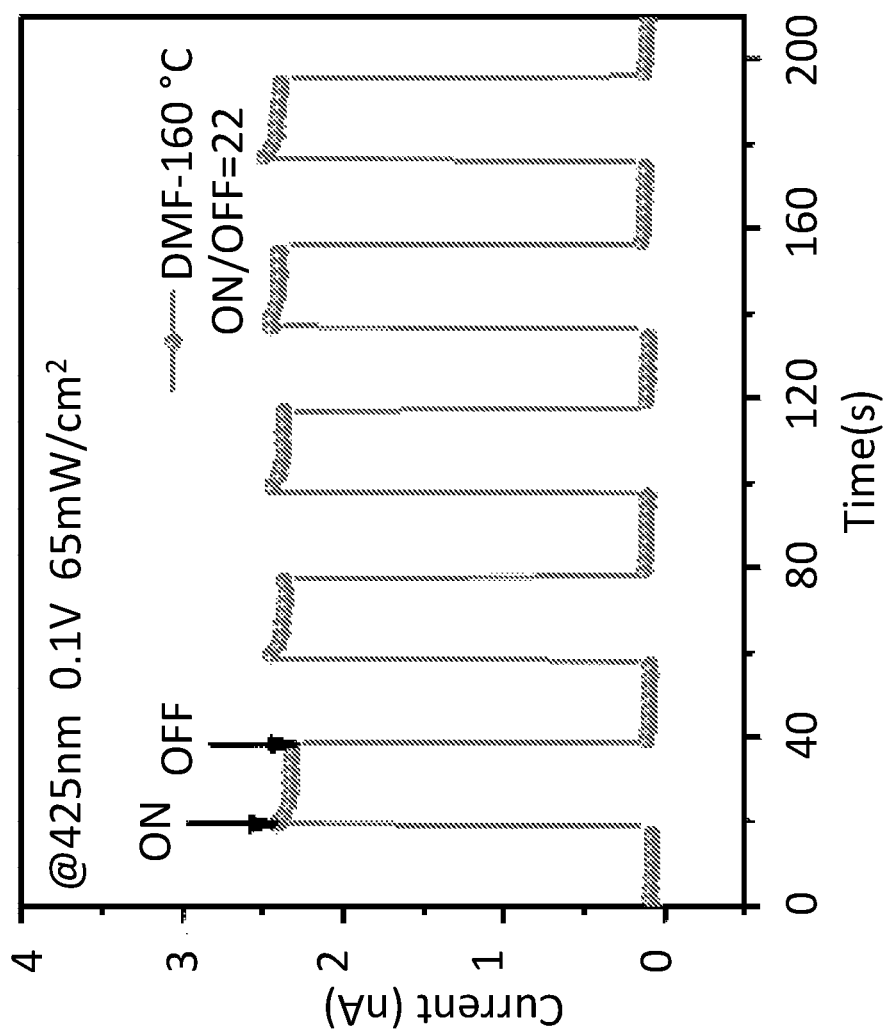

FIG. 18A shows XRD spectra of $Cs_2TeI_6$ films deposited by electrospray. FIG. 18B depicts UV-vis-NIR transmission spectrum of $Cs_2TeI_6$ films; the inset is about band gap fitting. FIG. 18C shows the room-temperature I-V characteristic curve of $Cs_2TeI_6$ device in dark. FIG. 18D shows the current-time (I-t) curve at 0.1 V of $Cs_2TeI_6$ perovskite detector under 425 nm optical light.

Figure 19:
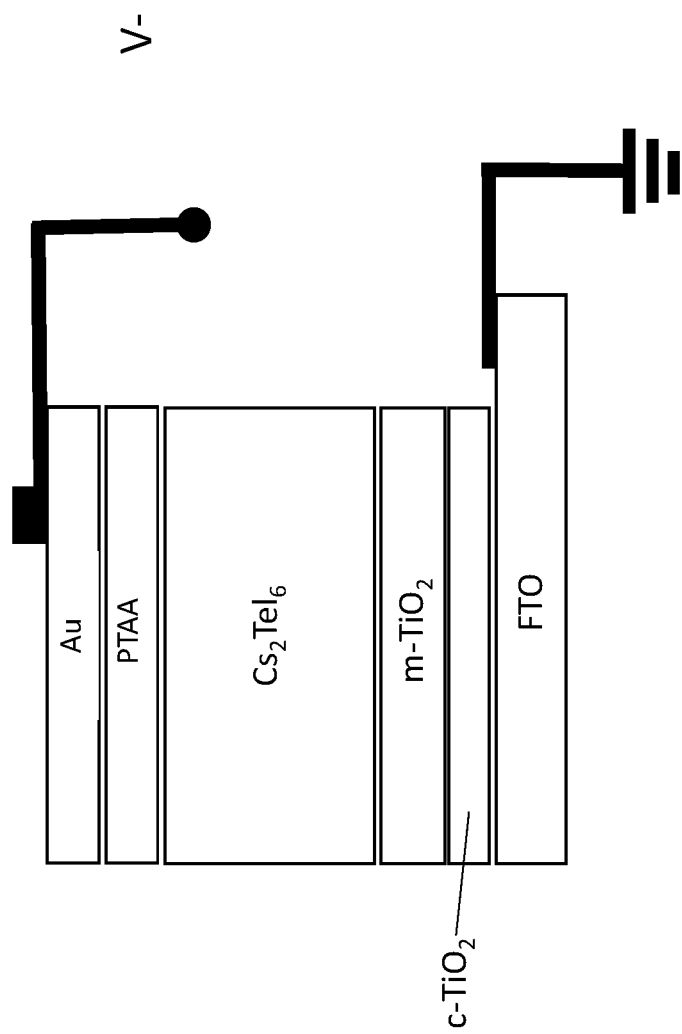

FIG. 19 is a schematic diagram of a photodetector.

DETAILED DESCRIPTION

Methods and devices that use alkali metal chalcohalides having the chemical formula $A_2TeX_6$, wherein A is Cs or Rb and X is I or Br, to convert hard radiation, such as incident X-rays, gamma-rays, and/or alpha particle radiation, into an electric signal are provided. The devices include optoelectronic and photonic devices, such as photodetectors and photodiodes.

$Cs_2TeI_6$ is one example of an alkali metal chalcohalide that can be used. $Cs_2TeI_6$ is composed of high atomic number elements, has high electrical resistance, and exhibits high air and moisture stability, making it suitable as a sensitive hard radiation photoconductor. In addition, unlike the traditional perovskite structures, such as $CsPbI_3$ and $CsSnI_3$, $Cs_2TeI_6$ is a deficient perovskite and has isolated octahedra of $[TeI_6]^{2-}$, which results in a 0-D perovskite structure, as seen in FIG. 1A.

High-purity, high-quality crystalline films of the alkali metal chalcohalides can be used as a photoactive material in a variety of optoelectronic and photonic devices. Detector-grade alkali metal chalcohalides can be grown with high chemical purity and high crystal quality. Methods of making detector-grade $Cs_2TeI_6$ films, and films of other alkali metal chalcohalides, are demonstrated in the Example below.

One aspect of the invention provides devices for the detection of incident radiation. In some embodiments the devices comprise: a photoactive layer comprising, consisting of, or consisting essentially of an alkali metal chalcohalide having the chemical formula $A_2TeX_6$, wherein A is Cs or Rb and X is I or Br; a first electrode in electrical communication with the photoactive layer; and a second electrode in electrical communication with the photoactive layer. In such devices, the first and second electrodes are configured to apply an electric field (i.e., an applied bias) across the photoactive layer. When incident radiation is absorbed by the alkali metal chalcohalide, electron-hole pairs are formed in the material and a photocurrent is generated. The devices can further comprise one or more additional electronic components configured to measure the photocurrent. The incident radiation can comprise particle radiation, such as alpha particle radiation; or electromagnetic radiation, such as gamma radiation (i.e., wavelengths in the range from about $1\times10^{-10}$ to about $2\times10^{-13}$ meters) and/or X-ray region radiation (i.e., X-ray energy in the range of 1 keV-100 keV, which corresponds roughly to wavelengths of 0.01 nm-1 nm). Some embodiments of the detectors are operable at room temperature (e.g., at temperature in the range from about 20° C. to about 25° C.).

Films of the alkali metal chalcohalides can be prepared in a low temperature process using an electrostatic assisted spray technique at atmospheric pressure, as illustrated in the Example. However, other known methods for growing or depositing single-crystalline alkali metal chalcohalides can be used. In an electrospray assisted spray technique, a solution comprising the alkali metal chalcohalide is electrosprayed onto a device substrate. The thickness of the film can be controlled via the duration of the spray. Using electrospray deposition, thick alkali metal chalcohalide films can be grown. By way of illustration, films having a thickness of at least 0.5 mm, at least 1 mm, or at least 2 mm can be formed. Suitable solvents for use in the electrospray solutions include, but are not limited to, dimethyl formamide (DMF), n-butyl alcohol (NBA), isopropanol (IPA) ethanol (EA), and dimethyl sulfoxide (DMSO) and mixtures thereof.

Films of the alkali metal chalcohalides, such as films of $Cs_2TeI_6$, are characterized by high resistivities. For example, various embodiments of the alkali metal chalcohalide films have a resistivity of at least $3\times10^{10}$ Ω·cm. This includes embodiments of the alkali metal chalcohalide films having a resistivity of at least $4\times10^{10}$ Ω·cm and further includes embodiments of the alkali metal chalcohalide films having a resistivity of at least $5\times10^{10}$ Ω·cm. By way of illustration, some embodiments of the $Cs_2TeI_6$ films have a resistivity in the range from $3.5\times10^{10}$ Ω·cm to $5\times10^{10}$ Ω·cm, including in the range from $3.5\times10^{10}$ Ω·cm to $4.5\times10^{10}$ Ω·cm. Methods for measuring the resistivity of a film of are described in the Example.

Hard radiation detectors that incorporate the alkali metal chalcohalides as a photoactive material are characterized by a strong photoresponse to optical light. For example, various embodiments of X-ray detectors that include a photoactive layer comprising, consisting of, or consisting essentially of an alkali metal chalcohalide, such as $Cs_2TeI_6$, have an on-off ratio of at least 10, at least 12, or at least 15, under a bias of 1V, as measured under ambient light (~0.8 mW·cm$^{-2}$). The detectors are also characterized by a high sensitivity. For example, various embodiments of X-ray detectors that include a photoactive layer comprising, consisting of, or consisting essentially of an alkali chalcohalide have a sensitivity of at least 100 nC·R$^{-1}$cm$^{-2}$, at least 150 nC·R$^{-1}$cm$^{-2}$, or at least 190 nC·R$^{-1}$cm$^{-2}$ under 40 kVp X-rays at an electrical field of 250 V·cm$^{-1}$. As a result, photodetectors that utilize the alkali metal chalcohalides as a photoactive material can operate with very low radiation doses in many applications, including medical and security check applications. Methods for measuring the on-off ratio and the sensitivity of a radiation detector are described in the Example.

An embodiment of a device for the detection of incident radiation, such as incident X-rays, gamma rays, or alpha-particles, generally includes: (a) the material comprising alkali metal chalcohalides having the chemical formula $A_2TeX_6$, wherein A is Cs or Rb and X is I or Br; (b) a first electrode in electrical communication with the material; (c) a second electrode in electrical communication with the material, wherein the first and second electrodes are configured to apply an electric field across the material. At least one of the first and second electrodes is desirably transparent to the incident radiation. Electrodes may comprise, for example, an electrically conductive oxide, such as FTO, or a metal, such as gold or aluminum. When the incident radiation is absorbed by the alkali metal chalcohalide, electron-hole pairs are generated and drift toward their respective electrodes under an applied electric field. Electron or hole photocurrents can be measured separately by changing the bias direction. The device may further include a signal amplifier to amplify the photocurrent signal generated by the photodetector, a processor, data storage (e.g., a computer-readable medium) and an output interface, such as a computer interface. Computer-readable medium 106 is an electronic holding place or storage for information so the information can be accessed by the processor as understood by those skilled in the art. The computer-readable medium can include, but is not limited to, any type of random access memory (RAM), any type of read only memory (ROM), any type of flash memory, etc. such as magnetic storage, optical disks, digital versatile disc (DVD), etc.), smart cards, flash memory devices, etc. The processor executes instructions that may be carried out by a special purpose computer, logic circuits, hardware circuits, or other methods. The processor may be implemented in hardware and/or firmware. The processor executes an instruction, meaning it performs/controls the operations called for by that instruction. The term "execution" is the process of running an application or the carrying out of the operation called for by an instruction. The instructions may be written using one or more programming language, scripting language, assembly language, etc. The processor can be operably coupled with the computer-readable medium and an output interface that is configured to receive, to send, to display, and/or to otherwise process the signal generated by the photodetector. For example, the processor, computer-readable medium and output interface, may be configured to generate a graphical display of the measured photocurrent.

Their high sensitivities, and the ability to grow thick crystalline layers of the alkali metal chalcohalides, render these compounds well suited for use as photoactive materials in large-size, flat-panel X-ray imagers.

Unless otherwise indicated herein, the values for measured or measurable quantities refer to the value of those quantities at room temperature (~23° C.) and pressure (~1 atm).

EXAMPLES

Example 1

In this example, it is reported that the isotropic compound $Cs_2TeI_6$ can be deposited as thick films, which to provide a digital X-ray imager. Bulk crystals of cubic $Cs_2TeI_6$ are shown to have a resistivity on the order of $10^{10}$ Ω·cm at room temperature, and a band gap of 1.58 eV. The crystal structure of $Cs_2TeI_6$ has a high-symmetry cubic structure with good air and moisture stability. As a molecular iodosalt compound, $Cs_2TeI_6$ can be dissolved in many organic solvents and kept for a long time in air without phase transitions or ambient hydrolysis.

Here, an electrostatic assisted spray (E-spray) deposition method was employed to grow thick $Cs_2TeI_6$ film under atmospheric conditions. The E-spray coating process allows a large area, as well as reproducible and uniform fabrication of high-quality thin films. Moreover, the method has the capability of controlling the droplet conditions, and can further be extended to a continuous and scalable fabrication technique for potential use in mass production. In this example, it is reported that the morphology and thickness of the all-inorganic $Cs_2TeI_6$ film can be engineered by adjusting the temperature and E-spray parameters. A device configuration involving several microlayers was designed and fabricated, and shown to possess strong optical and a low dose X-ray response with a sensitivity of 192 nC·R$^{-1}$cm$^{-2}$.

Materials and Methods

Synthesis of TeI$_4$

Elemental Te (99.999% wt.) and I$_2$ (99.999% wt.) with a ratio of 1:2 were loaded into a fused silica ampoule with an inner diameter of 10 mm and sealed under a vacuum of $5 \times 10^{-2}$ Pa. The sealed samples were heated to 170° C. over 10 h and held at the maximum temperature (300° C.) for 48 h before cooling to room temperature. Then the resulting dark gray (TeI$_4$) products, as confirmed by powder X-ray diffraction, were ground and stored in a nitrogen-filled glovebox for further use.

Electrospray of $Cs_2TeI_6$

N, N-dimethylformamide (DMF) and ethanol were mixed in volume ratios of 7:3, 6:4, 5:5, 3:7 and 2:8. Then, 57% hydriodic acid was added with a concentration of 5 μL·mL$^{-1}$. $Cs_2TeI_6$ solutions with concentrations in the range of 5-30 mg·mL$^{-1}$ were prepared by dissolving CsI (Sigma-Aldrich, 99.9%) and TeI$_4$ (synthesized) into the mixed solvent with the molar ratio of 2:1. A one-step coating process (E-spraying technique) has been developed in our laboratory. The $Cs_2TeI_6$ solutions were loaded into a plastic syringe. A stainless steel needle with an inner diameter of 0.06 mm was used. The spraying rate was controlled by a syringe pump (SyringePump, NE-1000) at a range of 1.0-1.5 mL·h$^{-1}$. An electric field of 12-17 kV was applied by a DC power supply (Glassman High Voltage INC, FJ120) between a metal orifice and the fluorine-doped tin oxide (FTO) substrate. The distance from the nozzle to the FTO substrate was in the range of 4-10 cm. During the E-spraying deposition, the substrate temperature was kept within the range of 110-175° C. The thickness of the $Cs_2TeI_6$ layers was controlled by the E-spraying duration time.

Characterization

Powder X-ray diffraction data (XRD) were collected on a Rigaku MiniFlex600 X-ray diffractometer (Cu Kα, 1.5406 Å) operating at 40 kV and 20 mA. Both Hitachi 4800 and 8030 SEM instruments were used for surface morphology observation. Simultaneously, the chemical compositions of local areas in the $Cs_2TeI_6$ films were characterized using energy dispersive spectrometer (EDS) analysis. Transmittance of the perovskite films was obtained from 300 to 1200 nm at room temperature using a Shimadzu UV-3600 PC double-beam, double-monochromator spectrophotometer. X-ray photoelectron spectroscopy (XPS) measurements were carried out on an Omicron ESCA Probe XPS spectrometer (Thermo Scientific ESCALAB 250Xi) using 150 eV pass energy; a 1 eV step size for survey scan and 50 eV pass energy; and a 0.05 eV step size for band edge scan. Surface etching was performed by Ar-ion sputtering with 3 keV acceleration for 10 seconds.

Current-voltage (I-V) curves were measured at room temperature using a Keithley 6517b picoammeter/voltage supply under both low and high bias. The photosensitivity was conducted using a custom-made setup. The multilayer device was placed inside a guarded, dark box. The device was then exposed to either ambient visible light or a 473 nm laser source (30 mW·cm$^{-2}$, 1.2 mm laser spot diameter) with an ON-OFF state. The current-time (I-t) was obtained by a Keithley 6517b. In addition, current density-voltage (J-V) characteristics of the devices were measured in air under 1 sun illumination (AM1.5G, 100 mW·cm$^{-2}$) using a certified solar simulator (Abet Technologies) and Keithley 2400 source meter. For X-ray response measurements, $Cs_2TeI_6$ detectors were exposed to an X-ray source (Amptek Mini-X X-ray tube system with a silver target), with a low dose rate of 0.2-2 R·min$^{-1}$. X-rays from the source were collimated using a brass cylinder with a 2-mm-diameter circular central bore. The source-to-detector distance was 5 cm. The X-ray intensity was modulated by adjusting the tube bias and current. The induced photocurrent signal of the detector was recorded as a function of time using a Keithley 6517b.

Synthesis and Growth of $Cs_2TeI_6$ Bulk Crystal

The $Cs_2TeI_6$ crystals were synthesized from $TeI_4$ (mentioned above) and CsI (Sigma-Aldrich, 99.9%). The carbon coating silica ampoules were used for synthesis and crystal growth. The starting materials were sealed under a vacuum of ~$10^{-4}$ torr and heated at 610° C. for 24 h. The polycrystalline samples were directly subjected to crystal growth in a modified vertical two-zone Bridgman furnace equipped with a computer controlled linear stage. The temperature of the hot zone was 630° C., while the cold zone was 450° C. The crystal growth was carried out with a lowering rate of 0.5 mm per hour. After the crystal growth, black $Cs_2TeI_6$ ingots 10 mm in diameter and 60 mm in length were obtained.

Device Fabrication Process

The FTO substrate was etched using Zn metal powder and diluted HCl (2M). Then, the substrates were cleaned by detergent cleaner, deionized water, acetone, and isopropyl alcohol, respectively. Finally, the substrates were dried with nitrogen gas at room temperature.

The compact $TiO_2$ layer (c-$TiO_2$) was prepared by the sol-gel method according to a previous report on pre-patterned FTO-coated glass, and followed by 500° C. annealing for 20 minutes. (See, Song, T. B., et al. Performance enhancement of lead-free tin-based perovskite solar cells with reducing atmosphere-assisted dispersible additive. *ACS Energy Lett.* 2017, 2, 897-903.1.) In brief, sol-gel $TiO_2$ precursor was prepared by dissolving titanium isopropoxide (TTIP) into ethanol and HCl. The mesoporous $TiO_2$ (m-$TiO_2$) layer composed of 20 nm sized particles (Dyesol LTD.) was diluted with ethanol anhydrous (1:3.5 weight ratio) and then deposited onto c-$TiO_2$/FTO substrates by spin coating at 3000 rpm for 30 s. The spin-coated $TiO_2$ film was gradually heated to 500° C.; baked at this temperature for 15 min; and cooled to room temperature. After that, the substrates were treated in a 0.02 M aqueous solution of $TiCl_4$ for 30 min at 80° C.; rinsed with ethanol and deionized water; and annealed at 500° C. for 30 min. Then, the $Cs_2TeI_6$ film was deposited on the mesoporous $TiO_2$ layer by E-spraying, as mentioned above. Poly [bis (4-phenyl) (2,4,6-trimethylphenyl) amine] (PTAA) doped with tetrakis (pentafluorophenyl) borate (TPFB) was used as hole-transporting layer, which was deposited by spin-coating at 3000 rpm for 30 s. Finally, a gold contact was deposited by thermal evaporation with a thickness of approximately 60 nm.

Results and Discussion

For FPXI applications, generally 20-80 keV hard X-rays are employed, which determines the thickness for the photodetector active layers. (See, Hoheisel, M., Review of medical imaging with emphasis on X-ray detectors. *Nucl. Instrum. Meth. Phys. Res. A.* 2006, 563, 215-224; Kasap S., et al., Amorphous and polycrystalline photoconductors for direct conversion flat panel X-Ray image sensors. *Sensors.* 2011, 11, 5112-5157; and Kasap, S. O., X-ray sensitivity of photoconductors: application to stabilized a-Se. *J. Phys. D: Appl. Phys.* 2000, 33, 2853-2865.) Using a MCNP (Monte Carlo N-Particle code) simulation, it can be seen that the stopping power of $Cs_2TeI_6$ is close to that of CdTe when illuminated by 50 keV X-ray photons, and superior to α-Se (FIG. 1B). (See, X-5 Monte Carlo Team, "MCNP-A general Monte Carlo N-particle transport code, version 5-Vol. II: User's guide," Los Alamos National Laboratory Report No. LA-CP-03-0245, Los Alamos, N M, 2008.) A schematic diagram of the homemade E-spray coating system used for depositing $Cs_2TeI_6$ films of uniform density and thickness is shown in FIG. 1C. To deposit $Cs_2TeI_6$ films, FTO substrates were adopted, since they can act as one of the electrodes for the detector. These substrates were fixed on the electrically grounded hotplate held at a certain temperature. To prevent shorting paths of direct contact between the top and bottom electrodes that can arise from possible pinholes and cracks in the thick films, a multilayer structure was designed with compact and mesoporous $TiO_2$ layers spin-coated on FTO, respectively (inset of FIG. 1B).

The $Cs_2TeI_6$ solution was spray-coated onto the substrates using a programmable fluid pump. Well-dispersed droplets formed by the Coulomb repulsive force and guided by the electrical gradient between the nozzle and the substrate were densely deposited without any rebound effect. The polarity (permittivity) and conductivity of the precursor solution are critical parameters to determining the spray droplet size under a high static electrical field. The $Cs_2TeI_6$ crystals formed immediately as the solvent evaporated from the heated substrate. FIG. 2 presents a set of SEM images of the surface of the $Cs_2TeI_6$ thick film prepared using a mixed DMF/ethanol solution. Although the solubility increased with higher DMF volume fraction, larger size droplets were generated, as seen in FIG. 2A. On the contrary, a uniform $Cs_2TeI_6$ thick film was obtained under a low electrical bias of 10 kV by using more ethanol (see FIG. 2B). On the film surface, however, cubic $Cs_2TeI_6$ grains were readily observed, that were caused by the limited solubility of $Cs_2TeI_6$ in ethanol (inset of FIG. 2B). Subsequently, a 5:5 volume ratio of DMF: ethanol solvent mixture with a $Cs_2TeI_6$ concentration of 20 mg·mL$^{-1}$ was used.

The substrate temperature during E-spray coating plays an important role in controlling the rates of solvent vaporization and perovskite crystallization. At a substrate temperature of 110° C., the films appeared to have a dendritic structure, as seen in FIG. 2C. Higher deposition temperatures led to a material with fewer macroscale structure defects, and thus with better transport properties. However, when the temperature of the substrate reached ~175° C., the dense film was decorated by sparkling crystals with grain size up to 1 μm, as shown in the inset of FIG. 2D. It was determined that these crystals were CsI, and arose from the decomposition of $Cs_2TeI_6$ to $TeI_4$ and CsI at that temperature. Finally, an optimal substrate temperature range of 150-165° C. for $Cs_2TeI_6$ thick film preparation was chosen.

Another crucial parameter is the size of the $Cs_2TeI_6$ precursor droplets generated at the nozzle and their dispersion over the substrate during film formation. This is affected by the spray rate, the electrical potential applied on the nozzle, and the distance between the nozzle and the FTO substrate. Therefore, a well-adjusted balance between solvent evaporation and $Cs_2TeI_6$ crystallization rates is necessary. It was found that an applied bias of 15 kV coupled with an optimized nozzle to substrate distance of 7.5 cm, and a solution flow rate of 1.2 mL·h$^{-1}$, gave sufficiently small spray droplets and a granular surface morphology, as shown in FIG. 2E.

Figures 3E, 3F:
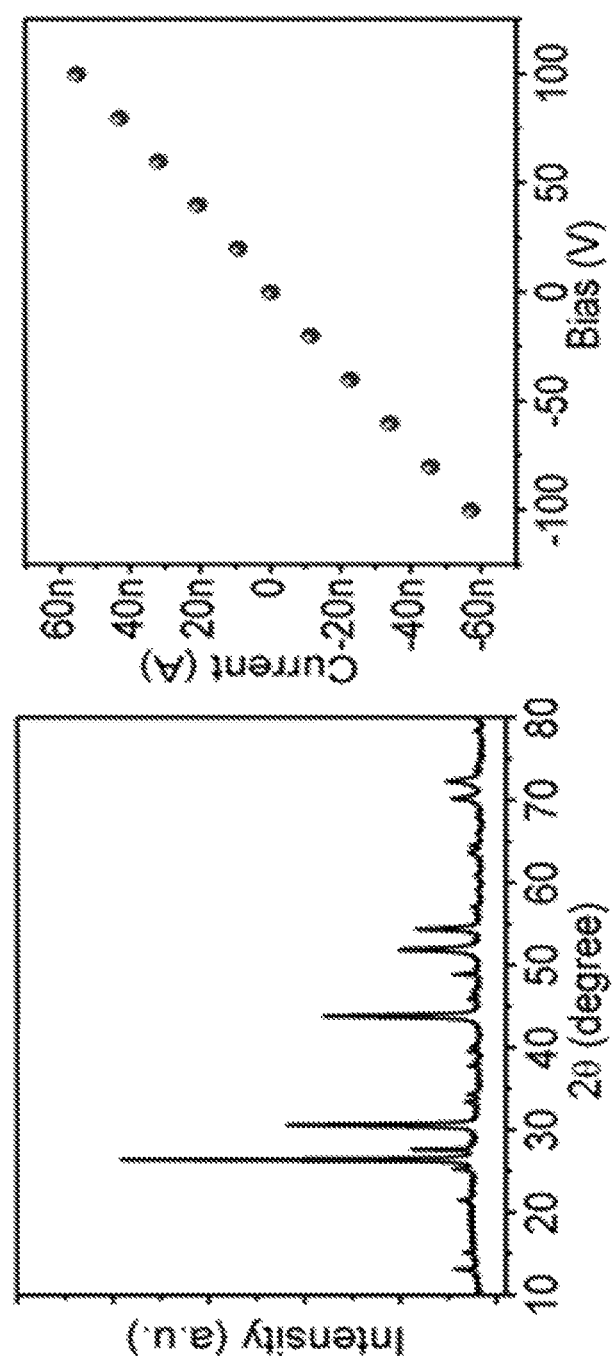
FIG. 3E shows X-ray diffraction.
FIG. 3F shows an I-V curve of a 0.5 mm thick $Cs_2TeI_6$ bulk crystal.
Figure 6:
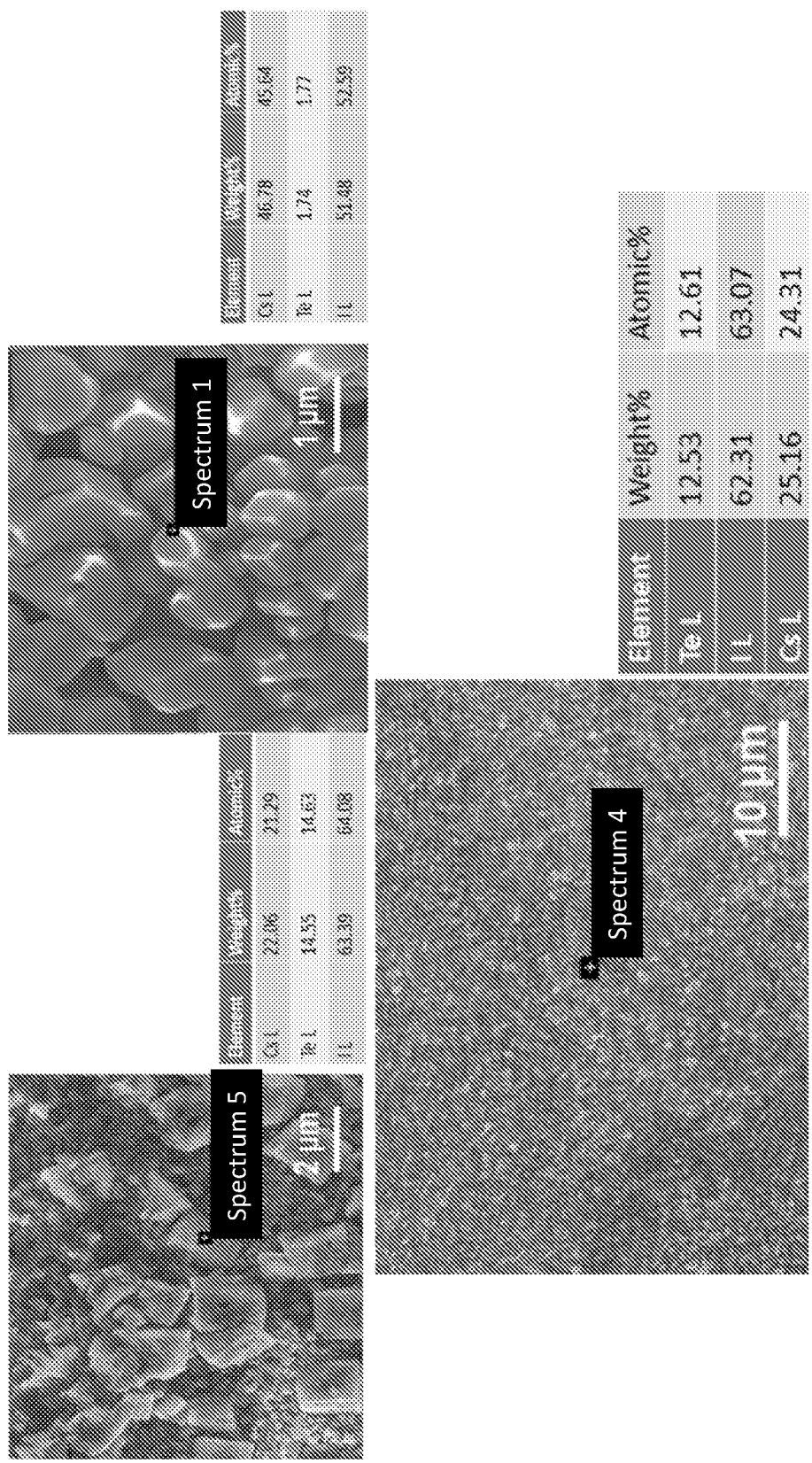
FIG. 6 shows composition measurements for $Cs_2TeI_6$ films using SEM-EDS.

The powder X-ray diffraction (XRD) patterns of the resulting $Cs_2TeI_6$ films deposited at 160° C. indicated single-phase formation (FIG. 3A). As observed under SEM/EDS analysis in FIG. 6, clear CsI peaks could be observed in the 175° C. deposited films. The band gap of the $Cs_2TeI_6$ films was approximately 1.57 eV, FIG. 3B, and was in agreement with that of the bulk $Cs_2TeI_6$ crystals, shown in FIG. 3D. The bulk crystals were made by reacting $Cs_2TeI_6$ at 610° C. for 24 h in a sealed silica tube. This reaction gave a black pure phase ingot which was characterized by XRD (FIG. 3E). The electrical resistivity of this bulk crystal was $1.15 \times 10^{10}$ Ω·cm (FIG. 3F). Despite the fact that the $Cs_2TeI_6$ film was prepared in ambient conditions, remarkably, the XPS showed only a negligible amount of oxygen in the film, as shown in FIG. 3C. This suggests that the deposited $Cs_2TeI_6$ crystals were protected during spraying in air from any oxidation by the evaporating DMF molecules, and after drying they were not subject to hydrolysis. A type of in-situ 'solvent annealing' might also have been occurring on the formed film at 160° C., leading to optimal film morphologies.

At the initial stage of layer coating, the $Cs_2TeI_6$ seeds nucleate sparsely on the substrate because of an insufficient number of the droplets. The coverage of the film gradually improves as the E-spray process continues forming well-defined polyhedral grains, as seen in FIG. 4A. The formed polycrystals are then covered by new $Cs_2TeI_6$ precursor droplets and undergo partial dissolution, as proposed in FIG. 4B. Subsequently, polycrystalline seeds will grow from solution as the solvents evaporate to the morphology shown in FIG. 4C. However, when the solvent evaporates too rapidly, nanosized $Cs_2TeI_6$ clusters tend to form because of the supersaturation of the $Cs_2TeI_6$ solute. This stimulates fast nucleation, which leads to the density deterioration of the thick film, as seen in FIG. 7.

Figure 8:
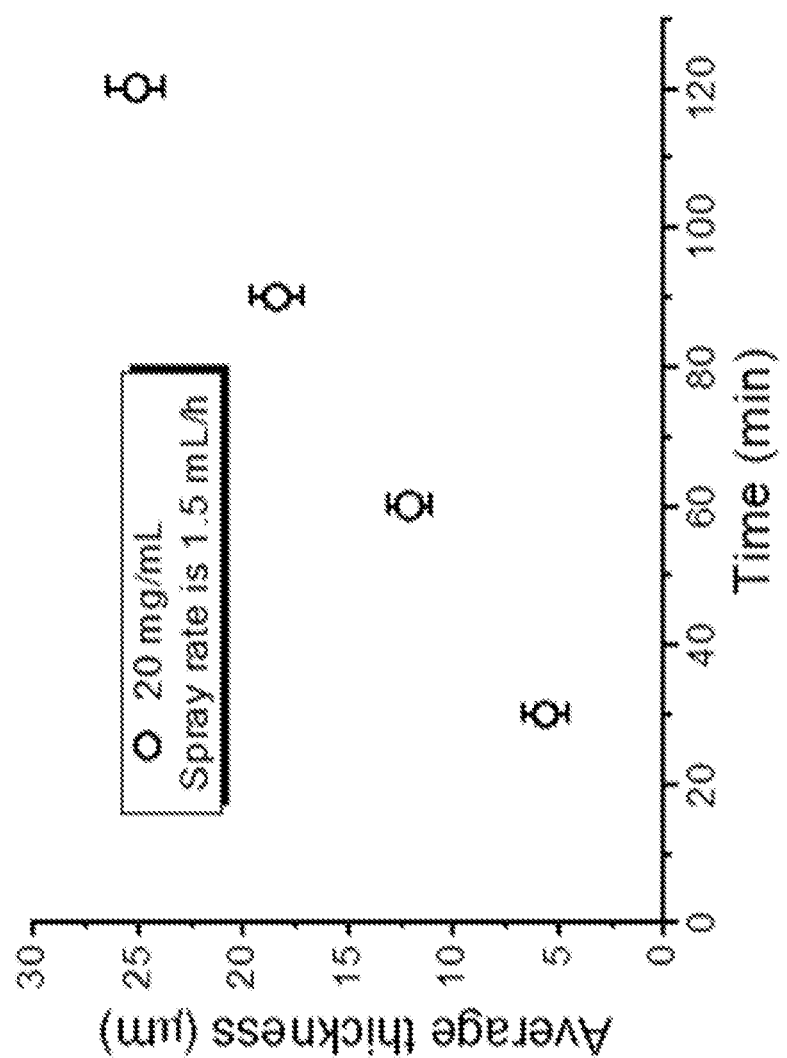
FIG. 8 depicts the average thickness of $Cs_2TeI_6$ films as a function of spray time.

FIG. 4D shows typical cross-sectional SEM images of glass/FTO/c-&m-$TiO_2$+$Cs_2TeI_6$/PTAA/Au multilayers, revealing the 23 μm thick $Cs_2TeI_6$ film grown over the $TiO_2$ layer. The film is densely packed and free from visible pin-holes and cracks. The thickness of the $Cs_2TeI_6$ layer can be varied by changing the spraying time and the solution density, FIG. 8.

Figure 9B:
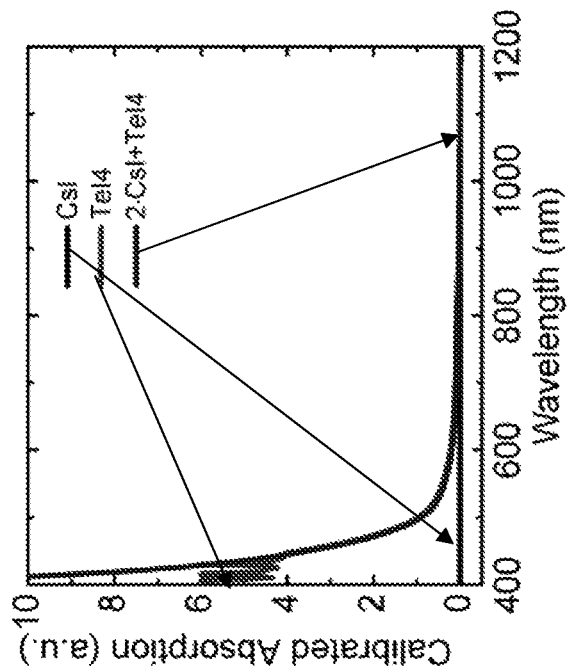
FIGS. 9A and 9B depict the absorption spectra of the $Cs_2TeI_6$ precursor solution.
Figure 9A:
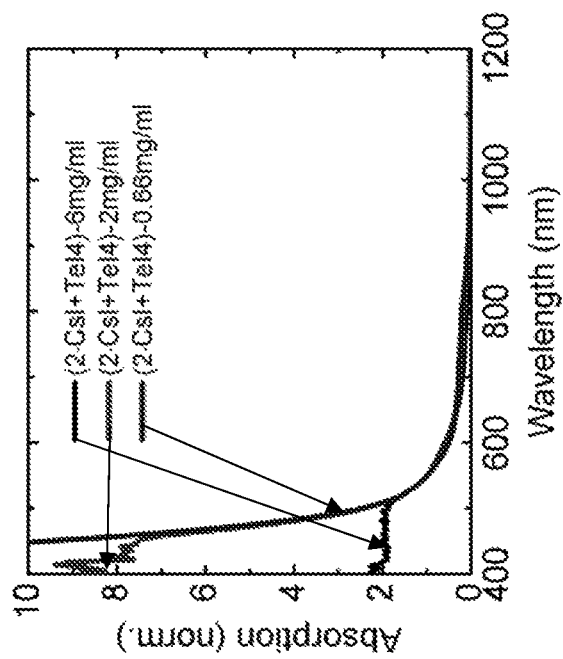

To verify that $Cs_2TeI_6$ nucleation does not occur in the precursor solution, optical absorption spectra were measured. These spectra are presented in FIGS. 9A and 9B, and show a significant blue shift with respect to the solid state $Cs_2TeI_6$ absorption, indicating that the material is dissolved into $Cs^+$ ions and $[TeI_6]^{2-}$ complexes to give a homogeneous solution.

To complete the device, a PTAA layer with a thickness of 50 nm was spin coated over the $Cs_2TeI_6$ film followed by deposition of thermally evaporated 60 nm Au contacts. The PTAA layer acted as a hole transport layer, leading to lower near surface recombination. The PTAA layer also served to reduce the surface roughness, to improve the contact with the Au electrode and at the same time prevents the diffusion of Au through the film grain boundaries blocking short circuit. Finally, the FTO electrode layer was connected to a ceramic chip with copper tape as the cathode. The top Au contact was connected to another pad in the chip to form the anode using a gold wire, resulting in a planar configuration detector.

Figure 5B:
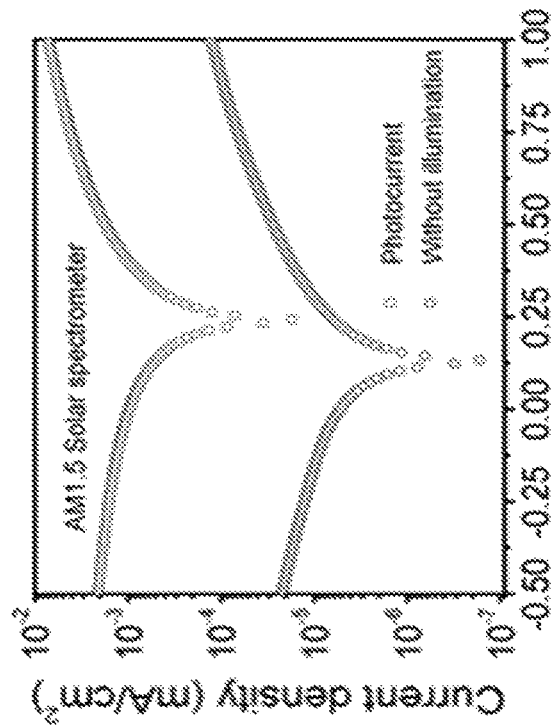
FIGS. 5A-5F show the electrical, optical and X-ray response behaviors of a 25-μm-thick planar $Cs_2TeI_6$ device.
Figure 5A:
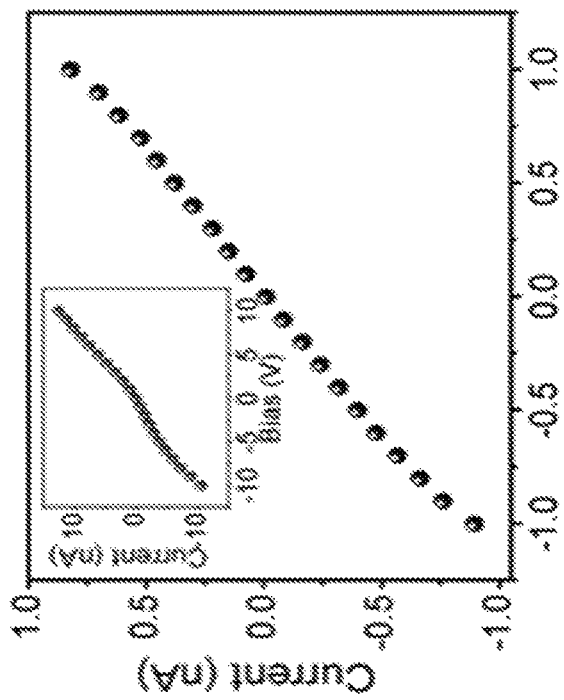

The electrical properties of a 25-μm-thick $Cs_2TeI_6$ device were characterized at room temperature. A resistivity of $4.2 \times 10^{10}$ Ω·cm for the $Cs_2TeI_6$ thick films was obtained by fitting the current-voltage (I-V) curve, as seen in FIG. 5A. The high resistivity of $Cs_2TeI_6$ may be mainly attributed to the electronic structure and high formation energy for intrinsic iodine vacancies, which reduces shallow level defects that can provide parasitic free charge carriers.

The dark state I-V curves of the devices showed good linear behavior even when subjected to a higher applied electrical field strength of 4000 V·cm$^{-1}$, as seen in the inset of FIG. 5A, indicating the absence of polarization effects. The device also showed photovoltaic behavior with a short-circuit current density of $7 \times 10^{-3}$ mA·cm$^{-2}$ at 1 V bias under intense light (AM 1.5 Solar spectrometer), as shown in FIG. 5B, which is about 60-100 times than that under ambient light. An abundance of free carriers was generated by the illuminating optical light, which resulted in high photo current.

Figure 5D:
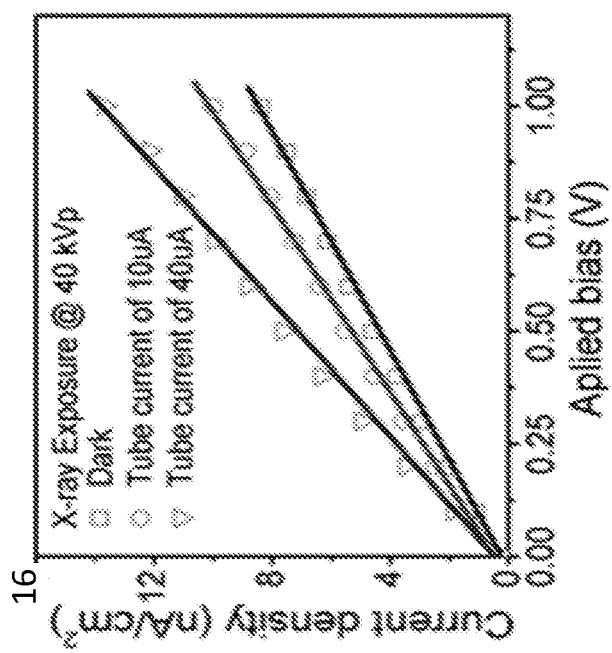
Figure 5C:
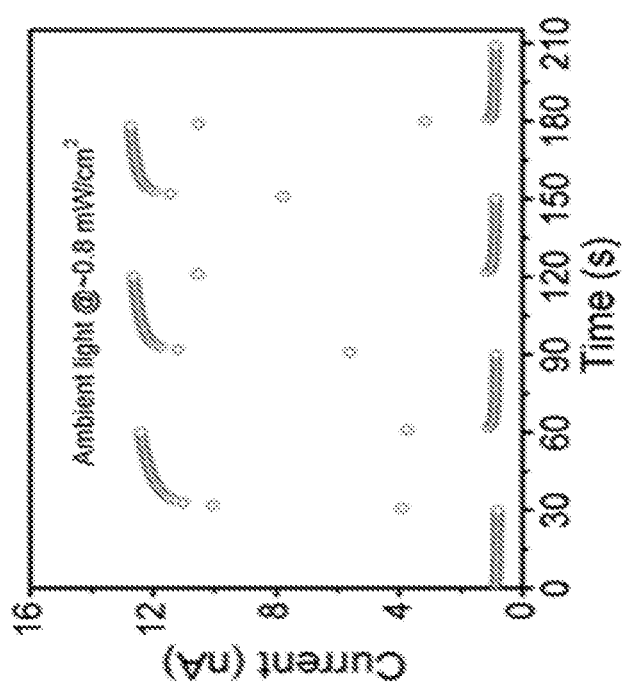

The photo current of the $Cs_2TeI_6$ based device was measured over time to determine the time dependence of the photoconductive effect and magnitude during and after optical excitation, as seen in FIG. 5C. An on-off ratio of 15 was obtained under the ambient room light (~0.8 mW·cm$^{-2}$) illumination. A minor exponential increase was observed within seconds of illumination. Once the illumination was turned off, the current decreased instantaneously. At higher electrical fields, the current across the device is determined by a combination of the barrier height of the functional layers and current transmission through the contact interface. It is presumed that the photo-induced carriers are not blocked by the thin PTAA layer and Au ohmic contact, and no significant space charge is formed near the interface region.

Figure 10:
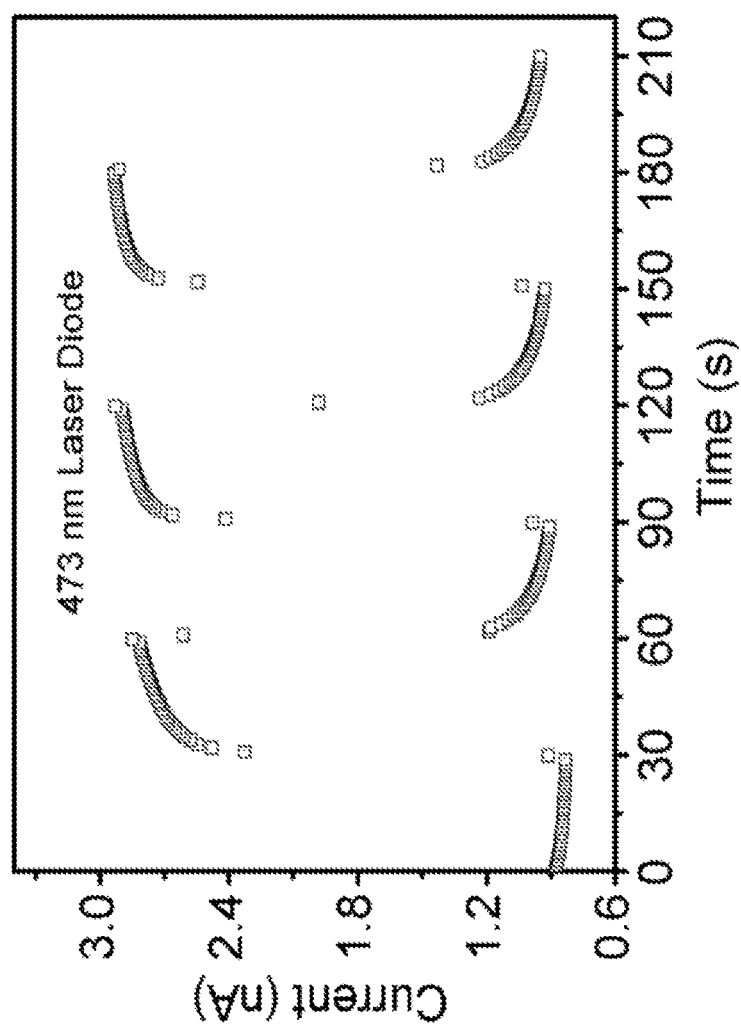
FIG. 10 depicts steady-state I-V measurements under an applied electric field of 400 V·cm$^{-1}$, illuminated by a 473 nm laser diode, with bias applied to the FTO contact.

Photo response was also observed when a week blue laser diode (473 nm, 1.2 mm laser spot diameter) was employed at normal incidence on the Au contact (FIG. 10). Note, however, that the slow exponential current decay observed in this case may be due to the interfacial defects near the compact/mesoporous $TiO_2$ layers and the poor conductivity of the unexcited $TiO_2$. The electron mobility lifetime product $(\mu\tau)_e$ of the $Cs_2TeI_6$ bulk crystals was estimated at $5.2 \times 10^{-5}$ cm$^2$·V$^{-1}$, as seen in FIGS. 11A and 11B, using an un-collimated $^{241}$Am (5.48 MeV) alpha source. Note that this value is for a polycrystalline sample. Since this experiment shows that X-ray induced electrons can be collected, it suggests that the electron drift length of $\lambda_e = (\mu\tau)_e E$ is on the order of 200 μm under an applied electrical field strength of 400 Vcm$^{-1}$. This supports the conclusion that the individual single crystal grains would have at least two orders of magnitude higher mu-tau product.

Figure 5F:
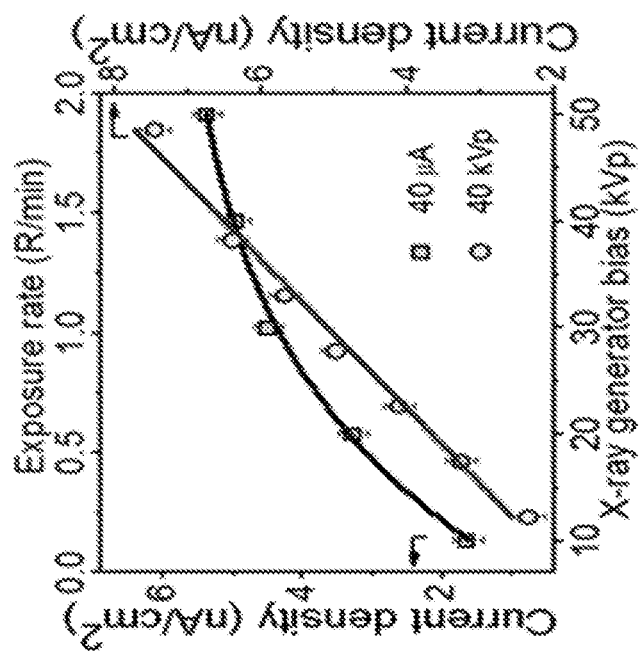
Figure 5E:
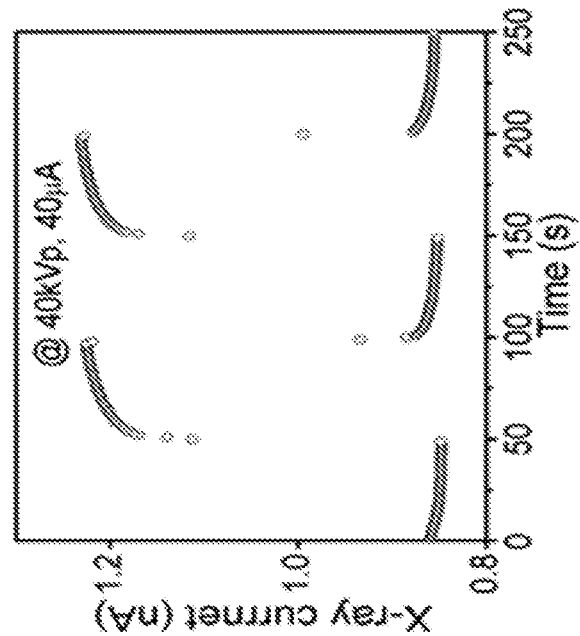

The response of $Cs_2TeI_6$ films to X-rays was studied using weak Ag X-ray radiation under cathode irradiation at room temperature. The electrical signal recorded as a function of applied bias from 0 to 1 V showed a linear response both in the dark and under irradiation of 40 kVp, 10 μA, and 40 μA, respectively (FIG. 5D). The strong time-dependent response of the $Cs_2TeI_6$ film devices to X-rays (40 kVp, 40 μA) was also demonstrated by turning the incident X-rays on and off under a fixed applied bias of 1 V, as shown in FIG. 5E. FIG. 5F shows the induced current density as a function of exposure for a fixed X-ray generator current of 40 μA. The exponential increase of the induced photo current is in good agreement with the change in X-ray generator output flux (FIG. 12).

The response of the $Cs_2TeI_6$ films to the exposure rate of the X-ray beam is shown in FIG. 5F, with beam energy of 40 kVp. The induced photocurrent density has a linear relationship with the current of the X-ray tube (exposure dose rate). A sensitivity of 192 nC·R$^{-1}$cm$^{-2}$ (equivalent to 19.2 μC·Gy$_{air}^{-1}$cm$^{-2}$) was derived by normalizing the averaged photocurrent as a function of the dose rate, with a bias of 1 V applied to the film. Considering the fluctuation of room temperature, the I-V characteristics of the $Cs_2TeI_6$ devices appeared to be reasonably constant for over 3 months (FIG. 13). In addition, pure black films were observed after flashing by the running water, which indicated preferable air and moisture stability for the as-grown $Cs_2TeI_6$ films.

TABLE 1

E-spray parameters for Cs$_2$TeI$_6$ thick film.

| Organic solvents | Substrate temperature/° C. | DC bias/ kV | Substrate-nozzle distance Dsn/cm | Spray rate/ mL · h$^{-1}$ |
|---|---|---|---|---|
| DMF: Ethanol | 160 | 15 | 7.5 | 1.2 |

Example 2

In this Example, the morphology of perovskite thin films has been systematically studied, including the effects of various electrospray parameters, such as electrical bias, substrate temperature, and solvents, to produce uniform and compact Cs$_2$TeI$_6$ films for use in photodetector devices. A set of optimized parameters for high quality Cs$_2$TeI$_6$ film deposition was found, and the optical and electrical properties of the films were tested to investigate the films' behavior. The responsivity of the device under 425 nm optical light illumination was also tested. It was also demonstrated that Cs$_2$TeI$_6$ films in photodetectors prepared by electrospray can be used in large scale production.

Results and Discussions

Effect of Solvent on the Morphology of Perovskite Films Made by an Electrospray Method.

Five solvent systems, consisting of dimethyl formamide (DMF) and n-butyl alcohol (NBA) (1:1 volume/volume); DMF and isopropanol (IPA) (1:1 v/v); DMF and ethanol (EA) (1:1 v/v); DMF and dimethyl sulfoxide (DMSO) (1:1 v/v) and DMF, were used to form the Cs$_2$TeI$_6$ (CsI:TeI$_4$=2: 1.1, molar ratio) precursor solutions during the electrospray, in order to find a solvent with good wettability on the substrate. The SEM images are shown in FIGS. 14A-14E. These low-boiling alcohols were added to DMF in the solvent separately. FIGS. 14A to 14C show top-view SEM images that demonstrate that the phenomenon of cluster in the thin film gradually weakened and the coverage rate gradually increased. FIG. 14D shows the result of DMF added with high boiling point DMSO: the surface of the film had no obvious cluster particles and was relatively smooth, but still had some small holes. FIG. 14E shows that when the solvent was pure DMF, the film surface became smooth and uniform with almost no pinholes. FIGS. 14F-14J are cross-sectional SEM images corresponding to FIGS. 14A-14E. It can be seen that cross sections of the films differed greatly: they were uneven, and even dendritic growth occurred when there were large cluster particles in the film. However, once the clusters in the film disappeared, the cross-sections became even and smooth.

FIGS. 15A-15E show the results of the contact angle of five different solvents tested on the substrates used for electrostatic spraying. FIG. 15F shows the broken line statistics of the contact angle test. Table 2 shows the properties of the solvents used in this experiment. It can be seen from the results of FIGS. 15A-15C that when the alcohol with low surface tension was added to the solvent, the contact angles on the substrate were very small, mainly between 3.9° to 6.2°. In the process of heating (150° C.) the substrate, the solvent rapidly evaporated completely, then formed an empty air area above the substrate. After that, many dry powder particles clustered together above this air area. Finally, the clusters deposited down and left a large number of holes in the film. FIG. 15D shows the result of a contact angle test by DMF with equal volume DMSO, with the value being approximately 27.1°. In this condition, solvent would not instantly evaporate completely. Because the boiling point of DMSO is 189° C., much higher than the boiling point of DMF (152° C.), DMSO was volatilized more slowly than DMF during the growth process. The DMSO volatilized completely after the continuous heating process, leaving some nanoscale small holes formed by the volatilization of the remaining DMSO internal of the earlier deposited film. When pure DMF was chosen as the solvent, the contact angle changed to 11.6°, as shown in FIG. 15E. In this condition, the solvent evaporated at a constant and uniform rate, forming a dense film of good quality. The differences among the film morphologies were caused by the solvent contact characteristics on the substrates. FIG. 15F shows a broken line graph of the results from the contact angle test. FIG. 15G shows the falling process of the droplet, and how the droplet wets and spreads on the substrate. The course is divided into four related primary processes, which are: (i) the droplet is injected from the capillary; (ii) the drop falls down from the capillary; (iii) the drop wets the substrate; (iv) the drop spreads on the substrate.

In short, in order to obtain a film with the highest quality, the contact angle on the substrate is an important factor. The contact angle under this experimental condition was much more appropriate at about 10°. If a two-solvent system is chosen, there should not be too much difference between boiling points of the two solvents.

TABLE 2

Solvent properties

| Solvent | NBA | IPA | EA | DMSO | DMF |
|---|---|---|---|---|---|
| Boiling point (° C.) | 118 | 82 | 78 | 189 | 152 |
| Surface tension @ 20° C. (mN/m) | 24.6 | 21.7 | 22.3 | 43.5 | 37.1 |

Effect of Substrate Temperatures on the Grain Morphology of Perovskite Films Grown by an Electrospray Method.

During the process of electrostatic spraying, the substrate temperature can affect the volatilization of the solvent, changing the supersaturation of the solution, and thus affects the nucleation rate at the initial stage of the film growth. Furthermore, the temperature field provides a driving force for the grain growth, influencing the grain size and the crystallization quality. FIGS. 16A-16L show SEM images showing the grain morphology of the Cs$_2$TeI$_6$ films deposited by electrospray performed under different growth temperatures. When the substrate temperature was increased from 145° C. to 170° C., the grain grew up gradually and the grain boundary became clearer as well, as shown in FIGS. 16A-16F. The grain boundary became clear at 160° C. FIGS. 16G-16L are cross-sectional SEM images that display the film thickness information and the layered structure. According to the composition, three layers can be divided upward: the FTO substrate, the TiO$_2$ interlayer, and the Cs$_2$TeI$_6$ perovskite film. As the substrate temperature rose from 145° C. to 160° C., the thickness of the film also increased, owing to the growth of the grain. When the temperature rose to 160° C., the distinct increase in grain size resulted in a sudden change in film thickness, according to FIG. 16J. In contrast, if the substrate temperature continued to rise to 165° C., the thickness decreased slightly at first, then dropped conspicuously at 170° C. The reason for this decrease in thickness is that if the substrate temperature is too high, a large amount of solute will be taken away in the process of volatilization, while revaporization of the solute already deposited will occur, resulting in a loss of solute, followed by a loss of thickness. A higher growth temperature and super-fast evaporation rate can also result in the formation of internal pores in the film, as shown in FIGS. 16K and 16L. In this experiment, the optimum growth temperature was 160° C., taking into account the grain size and crystal quality, followed by energy-saving qualities and film thickness.

Effect of Electric Field on Film Morphology of Perovskite Films Grown by an Electrostatic Method.

During the spray process, the charged droplets undergo four processes: solvent evaporation, coulomb splitting, solidification, and deposition. The droplet at the end of the capillary will move toward the substrate under the action of the electric field force. During this movement, the solvent in the droplet will evaporate away, resulting in a decrease in volume and surface area of the droplet. However, the charge capacity of the droplet itself will not change. When the surface charge of the droplet is greater than the Rayleigh limit, the electrostatic repulsion force of the droplet will be greater than the surface tension, and the droplet will form a Taylor cone at both ends, and then split. Subsequently, smaller charged droplets will be ejected from the tip of the Taylor cone. This is the phenomenon known as coulomb splitting. After spraying small charged droplets, the surface charge of the original droplet will decrease, and the droplet will be restored to an ellipsoid shape. The droplet will then go through the above process several times, finally forming nanoscale droplets which will then be deposited on the substrate. At the end, after the solvent has completely evaporated, the deposited droplets will form a dense thin film on the substrate.

In electrostatic spraying, the electric field affects the dispersion of the droplets, as well as the quality of the film deposited. If no electric field is applied, the droplet will fall directly onto the substrate. At this time, the droplet is not dispersive and has a size equal to the diameter of the needle, causing poor films with many holes inside and a rough surface. When the applied electrical bias is low (6 kV), the surface charge of the droplets is as well, which means there is a low repulsive force between the drops, so that the dispersion degree of the droplets is not sufficient. The top-view SEM images under this spraying electrical bias are show in FIG. 17A; it can be seen that there are many sheets of grains in the film and some gaps between these grains. As the electrical bias increased to 8 kV, several large drops gradually dispersed into a number of smaller ones. At this time, the film morphology looked better than before, and the gaps were mostly filled, but there were still a few pinholes, as shown in FIG. 17B. Next, as the electrical bias was set at 10 kV, small droplets underwent further Cullen split and were dispersed into a stable conical jet. A dense and uniform film was formed with this completely dispersed cone jet, as demonstrated in FIG. 17C. However, if the electrical bias were increased up to 12 kV, the quality of the film would decrease, as shown as FIG. 17D, i.e., the cone jet would become unstable and disperse into a multi-jet mode. The whole process of jet evolution is shown in FIG. 17E. As the electrical field increases, the droplets will gradually experience the pattern of change from drops, to microdroplets, to a steady cone jet, to a multi-jet model, etc. In this Example, the spray electrical bias of 10 kV was found to be much more appropriate, matching with the selected solvent (DMF) and the injection quantity of flow (1 mL/h), as well as the specific syringe needle diameter (0.16 mm).

Characterization of $Cs_2TeI_6$ Film Deposited by an Electrospray Method.

FIG. 18A shows the X-ray diffraction (XRD) patterns for the deposited film prepared at 10 kV on glass/FTO/c-$TiO_2$/m-$TiO_2$ substrate, with the peaks at 26.5°, 30.7°, 43.9°, 51.9° and 54.4° assigned to the (222), (400), (440), (622) and (444) planes, respectively, for the cubic crystal structure of $Cs_2TeI_6$. The absorption spectra of perovskite $Cs_2TeI_6$ film prepared by electrospray at 10 kV under 160° C. were measured, as shown in FIG. 18B. There was a strong absorption at 680 nm, near the absorption wavelength of the forbidden band. The inset shows the bandwidth fitted by the ultraviolet absorption spectrum, with an indirect band gap of about 1.88 eV. The room-temperature I-V curve of $Cs_2TeI_6$ device measured in dark is shown in FIG. 18C; it exhibited a good linearity under 0.1V bias, and the resistivity of the whole device was approximately $5.06 \times 10^{10}$ Ω·cm. FIG. 18D exhibits the I-t curves measured under a very low forward bias of 0.1 V. With illumination of 425 nm light (~65 $mW/cm^2$), the photo current and dark current ratio values were about 22, which shows a high responsivity to optical light. This result demonstrates that this device can be used for the detection of X-rays.

Experimental Section

Materials Synthesis

Unless otherwise specified, all materials were purchased from either Kermel or Sigma-Aldrich, and used as received. $TeI_4$ was prepared using the vertical Bridgeman method. PTAA was purchased from p-OLED Photoelectric Technology Corp. $TiO_2$ Paste (18 NR-T) was purchased from Dyesol Corp.

Perovskite Thin-Film Fabrication

Perovskite thin films were formed on two layers of $TiO_2$-coated (compact $TiO_2$ (c-$TiO_2$) and mesoporous $TiO_2$ (m-$TiO_2$)), fluorine-doped tin oxide (FTO)-glass substrates. The FTO-glass substrates (6Ω/□) were cleaned by ultrasonication in soap, deionized water, ethanol, and acetone, respectively, and then dried under a stream of nitrogen. The c-$TiO_2$ was deposited by spin-coating (2000 rpm, 60 s) the precursor solution, titanium isopropoxide (95%, Sigma-Aldrich) diluted in isopropyl alcohol (10% v/v); then annealed at 500° C. for 30 min. The m-$TiO_2$ was spin-coated using the precursor sol-gel, 18 nm $TiO_2$ nanoparticle paste diluted in ethanol (2:7 v/v), at 5000 rpm for 25 s; followed by annealing at 500° C. for 30 min. For the first experimental group, the perovskite precursor solution was formed by mixing CsI with $TeI_4$ at a 2:1.1 M ratio in different solvents, including dimethyl formamide (DMF) and n-butyl alcohol (NBA) (1:1 v/v); DMF and isopropanol (IPA) (1:1 v/v); DMF and ethanol (EA) (1:1 v/v); DMF and dimethyl sulfoxide (DMSO) (1:1 v/v); DMF, respectively, for a total concentration of 10 mg/mL, then stirred at 60° C. water bath for 30 min. These five different perovskite precursor solutions were then deposited onto the glass/FTO/c-$TiO_2$/m-$TiO_2$ under ambient conditions by electrospray deposition, respectively. The electrospray setup consisted of a syringe and needle (internal diameter 0.16 mm); a syringe pump (LSP01-1a); a high positive bias power supply (Dong-Wen Technical Corp.); and aluminium foil as the plate ground electrode. During the electrospray deposition, a syringe attached to a syringe pump was filled with the as-prepared $Cs_2TeI_6$ solution. The flow rate was set at 1 mL/h. The electrospray was begun by applying a high positive bias of 10 kV at the electrode (nozzle head). The distance between the nozzle head and the ground electrode (aluminium foil) was 5 cm. The deposition time was 60 min, and the substrate was heated at 150° C. by a hotplate. For the second experimental group, the solvent was chosen as DMF to form the perovskite precursor solution. The growth temperature was set at 145° C., 150° C., 155° C., 160° C., 165° C., and 170° C., respectively. Other parameters were the same as before. For the third experimental group, the solvent was fixed as DMF, and then the temperature was set at 160° C. The perovskite film was deposited under different electric fields; the electrical biases were 6 kV, 8 kV, 10 kV and 12 kV. Other parameters remained the same.

Device Fabrication

The device architecture used was FTO/compact-TiO$_2$/mesoporous-TiO$_2$/perovskite (Cs$_2$TeI$_6$)/Poly [bis(4-phenyl) (2,4,6-trimethylphenyl) amine] (PTAA)/gold electrode, as shown in FIG. 19. The role of the c-TiO$_2$ layer was to transmit electrons. The m-TiO$_2$ layer was used as an intermediate layer between the c-TiO$_2$ and Cs$_2$TeI$_6$, to improve the interface bonding. Cs$_2$TeI$_6$ was the effective layer of the device. The layer of PTAA could smooth the Cs$_2$TeI$_6$ film surface in order to obtain a flat layer of Au electrode. Material synthesis, detector fabrication, performance testing, and characterization were all performed under ambient humidity (30%-60% relative humidity).

TiO$_2$-coated FTO-glass substrates and perovskite thin films were prepared as stated above. Afterward, the samples were transferred to a spin coater to deposit PTAA (15 mg/mL, chlorobenzol) at 2000 rpm for 60 s, then heated at 100° C. for 5 min. Finally, Au electrodes (2 mm×2 mm) were deposited by a thermal evaporation system under a vacuum of 1×10$^{-4}$ Pa.

Material Characterizations

The crystalline structure of the prepared materials was characterized by powder X-ray diffraction (Shimadzu). SEM images of the perovskite thin-films were taken by FESEM (FEI Nano SEM 450). UV-vis-NIR absorption spectra were tested using a Shimadzu 3150 UV-vis-NIR spectrophotometer (in the 200-1600 nm spectral range). I-V curves were measured using a Keithley 6517B Electrometer. I-t curves were tested using a 425 nm LED and a Keithley 6517B Electrometer.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for detecting incident radiation, the method comprising:

exposing a material comprising alkali metal chalcohalides having the chemical formula A$_2$TeX$_6$, wherein A is Cs or Rb and X is I or Br, to incident radiation comprising X-rays, gamma rays and/or alpha particles, wherein the material absorbs the incident radiation and electron-hole pairs are generated in the material; and measuring at least one of the energy and intensity of the absorbed incident radiation by detecting the generated electrons, holes, or both.

2. The method of claim 1, wherein the incident radiation comprises X-rays.

3. The method of claim 1, wherein the incident radiation comprises gamma-rays.

4. The method of claim 1, wherein the incident radiation comprises alpha-particles.

5. The method of claim 1, wherein the alkali metal chalcohalide is Cs$_2$TeI$_6$.

6. The method of claim 5, wherein the incident radiation comprises X-rays.

7. The method of claim 5, wherein the incident radiation comprises gamma-rays.

8. The method of claim 5, wherein the incident radiation comprises alpha-particles.

9. A device for the detection of incident radiation comprising:

a material comprising alkali metal chalcohalides having the chemical formula A$_2$TeX$_6$, wherein A is Cs or Rb and X is I or Br;

a first electrode in electrical communication with the material;

a second electrode in electrical communication with the material, wherein the first and second electrodes are configured to apply an electric field across the material; and a signal detector configured to measure a photocurrent generated by electron-hole pairs that are formed when the material is exposed to incident X-rays, gamma-rays, and/or alpha-particles.

10. The device of claim 9, further comprising: a computer readable medium operably coupled to the signal detector and configured to store photocurrent data; and a computer interface operably coupled to the computer readable medium and configured to generate a graphical representation of the photocurrent generated by the electron-hole pairs.

11. The device of claim 9, wherein the alkali metal chalcohalide is Cs$_2$TeI$_6$.

* * * * *